(12) United States Patent
Lee et al.

(10) Patent No.: US 10,431,680 B2
(45) Date of Patent: Oct. 1, 2019

(54) SEMICONDUCTOR DEVICE AND METHOD FOR MANUFACTURING THE SAME

(71) Applicant: SAMSUNG ELECTRONICS CO., LTD., Suwon-si, Gyeonggi-do (KR)

(72) Inventors: Sungsam Lee, Yongin-si (KR); Junsoo Kim, Anyang-si (KR); Hyoshin Ahn, Seoul (KR); Satoru Yamada, Yongin-si (KR); Joohyun Jeon, Suwon-si (KR); MoonYoung Jeong, Suwon-si (KR); Chunhyung Chung, Seoul (KR); Min Hee Cho, Suwon-si (KR); Kyo-Suk Chae, Suwon-si (KR); Eunae Choi, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 198 days.

(21) Appl. No.: 15/391,888

(22) Filed: Dec. 28, 2016

(65) Prior Publication Data
US 2017/0243973 A1 Aug. 24, 2017

(30) Foreign Application Priority Data

Feb. 23, 2016 (KR) .................. 10-2016-0021242

(51) Int. Cl.
*H01L 29/78* (2006.01)
*H01L 29/423* (2006.01)
*H01L 29/04* (2006.01)

(52) U.S. Cl.
CPC ........ *H01L 29/7827* (2013.01); *H01L 29/045* (2013.01); *H01L 29/4236* (2013.01)

(58) Field of Classification Search
None
See application file for complete search history.

(56) References Cited

U.S. PATENT DOCUMENTS

| 3,634,737 | A | * | 1/1972 | Maeda | .................. H01L 29/00 257/255 |
|---|---|---|---|---|---|
| 7,659,936 | B2 | | 2/2010 | Cho et al. | |
| 7,682,888 | B2 | | 3/2010 | Lee et al. | |
| 7,985,990 | B2 | | 7/2011 | Parikh et al. | |
| 8,022,445 | B2 | | 9/2011 | Yamaguchi et al. | |
| 8,039,878 | B2 | | 10/2011 | Peidous et al. | |
| 8,399,915 | B2 | | 3/2013 | Takaishi | |
| 8,901,630 | B2 | | 12/2014 | Huh et al. | |
| 2007/0069255 | A1 | * | 3/2007 | Kim | ................ H01L 21/823412 257/288 |
| 2008/0211018 | A1 | * | 9/2008 | Moriwaki | ......... H01L 21/26513 257/333 |

(Continued)

FOREIGN PATENT DOCUMENTS

| KR | 10-0641365 B1 | 11/2006 |
|---|---|---|
| KR | 10-2010-0043459 A | 4/2010 |
| KR | 10-2010-0079488 A | 7/2010 |

*Primary Examiner* — Walter H Swanson
*Assistant Examiner* — Kien C Ly
(74) *Attorney, Agent, or Firm* — Lee & Morse, P.C.

(57) ABSTRACT

A semiconductor device including a semiconductor substrate including a trench, the semiconductor substrate having a crystal structure; and an insulating layer covering an inner sidewall of the trench, wherein the inner sidewall of the trench has at least one plane included in a {320} family of planes of the crystal structure or at least one plane similar to the {320} family of planes.

17 Claims, 19 Drawing Sheets

(56) References Cited

U.S. PATENT DOCUMENTS

2010/0090258 A1* 4/2010 Takaishi ............... H01L 29/045
 257/255
2012/0326214 A1* 12/2012 Cho .................. H01L 27/10876
 257/288

* cited by examiner

SEMICONDUCTOR DEVICE AND METHOD FOR MANUFACTURING THE SAME

CROSS-REFERENCE TO RELATED APPLICATION

Korean Patent Application No. 10-2016-0021242, filed on Feb. 23, 2016, in the Korean Intellectual Property Office, and entitled: "Semiconductor Device and Method for Manufacturing the Same," is incorporated by reference herein in its entirety.

BACKGROUND

1. Field

Embodiments relate to a semiconductor device and a method for manufacturing the same.

2. Description of the Related Art

Some semiconductor devices may include a structure in which a semiconductor substrate is in contact with an insulating layer. The semiconductor substrate may include a crystalline semiconductor material

SUMMARY

The embodiments may be realized by providing a semiconductor device including a semiconductor substrate including a trench, the semiconductor substrate having a crystal structure; and an insulating layer covering an inner sidewall of the trench, wherein the inner sidewall of the trench has at least one plane included in a {320} family of planes of the crystal structure or at least one plane similar to the {320} family of planes.

The embodiments may be realized by providing a semiconductor device including a semiconductor substrate having a crystal structure and including a trench, a top surface of the semiconductor substrate having at least one plane included in a {100} family of planes of the crystal structure; and an insulating layer covering an inner sidewall of the trench, wherein the trench extends in one direction included in a <230> family of directions of the crystal structure.

The embodiments may be realized by providing a semiconductor device including a semiconductor substrate including an active region defined by a device isolation layer; and a trench intersecting the active region to extend into the device isolation layer, the semiconductor substrate having a crystal structure; a gate electrode in the trench; a gate insulating layer between the gate electrode and the semiconductor substrate; and source/drain regions at both sides of the trench, wherein the trench includes an inner sidewall that has at least one plane included in a {320} family of planes of the crystal structure or at least one plane similar to the {320} family of planes.

The embodiments may be realized by providing a semiconductor device including a semiconductor substrate having a crystal structure and including an active pattern defined by a device isolation layer, the active pattern including a sidewall having at least one plane included in a {320} family of planes of the crystal structure or at least one plane similar to the {320} family of planes; a gate electrode intersecting the active pattern; a gate insulating layer between the gate electrode and the active pattern; and source/drain regions at both sides of the gate electrode.

The embodiments may be realized by providing a semiconductor device including a semiconductor substrate having a crystal structure; a first device isolation layer defining a pixel region of the semiconductor substrate, the pixel region including a first sidewall having at least one plane included in a {320} family of planes of the crystal structure or at least one plane similar to the {320} family of planes; a well dopant layer formed in the pixel region, the well dopant layer being adjacent to a top surface of the pixel region and having a different conductivity type from the semiconductor substrate; a second device isolation layer formed in the well dopant layer to define first and second active portions spaced apart from each other; a transfer gate on the well dopant layer of the first active portion; and a floating diffusion region formed in the first active portion at a side of the transfer gate.

The embodiments may be realized by providing a semiconductor device including a semiconductor substrate including a trench, the semiconductor substrate having a crystal structure; and an insulating layer covering an inner sidewall of the trench, wherein the inner sidewall of the trench has at least one plane included in a {320} family of planes of the crystal structure or a plane having an angle within 2 degrees of the {320} family of planes of the crystal structure.

BRIEF DESCRIPTION OF THE DRAWINGS

Features will be apparent to those of skill in the art by describing in detail exemplary embodiments with reference to the attached drawings in which.

DETAILED DESCRIPTION

Figure 1A:
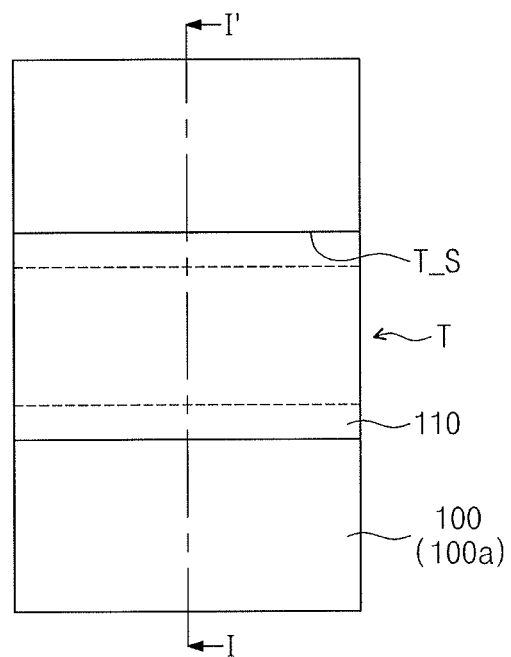
FIG. 1A illustrates a plan view of a semiconductor device according to some embodiments.
Figure 1A:
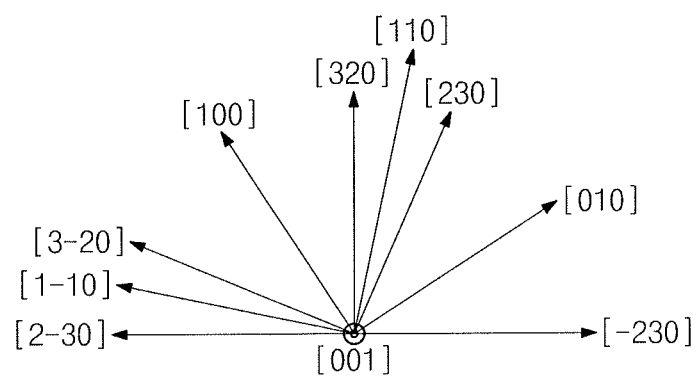
Figure 1B:
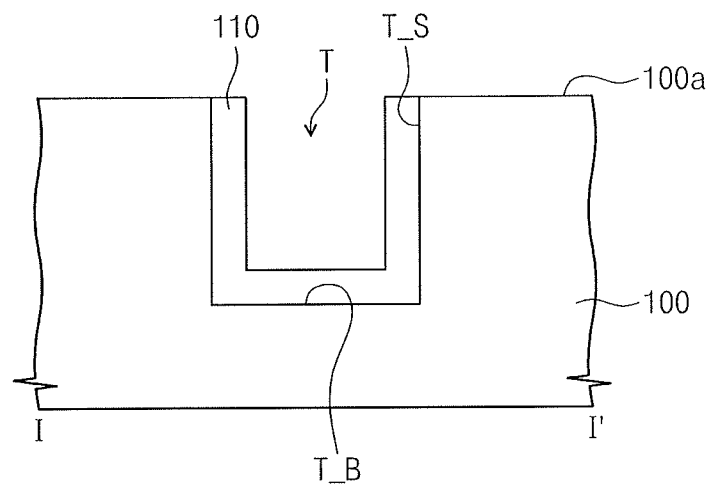
FIG. 1B illustrates a cross-sectional view taken along a line I-I' of FIG. 1A.
Figure 1B:
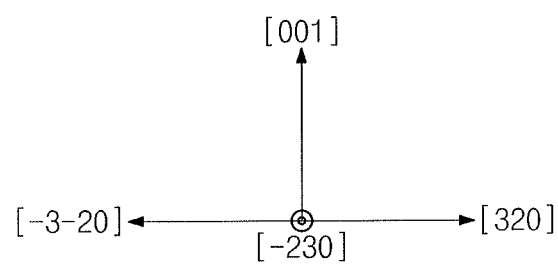

FIG. 1A illustrates a plan view of a semiconductor device according to some embodiments. FIG. 1B illustrates a cross-sectional view taken along a line I-I' of FIG. 1A.

Referring to FIGS. 1A and 1B, a semiconductor substrate 100 may be provided.

The semiconductor substrate 100 may have a crystal structure of a cubic system. For example, the semiconductor substrate 100 may have a diamond crystal structure. For example, the semiconductor substrate 100 may include single-crystalline silicon or single-crystalline germanium.

Some crystal directions of the crystal structure of the semiconductor substrate 100 are illustrated in FIGS. 1A and 1B. A crystal direction and a crystal plane of the semiconductor substrate 100, which have the same indices, may be perpendicular to each other. This may be because the crystal structure of the semiconductor substrate 100 may be included in a cubic system. For example, a (001) plane of the crystal structure of the semiconductor substrate 100 may be perpendicular to a [001] direction of the crystal structure of the semiconductor substrate 100, and a (320) plane of the crystal structure of the semiconductor substrate 100 may be perpendicular to a [320] direction of the crystal structure of the semiconductor substrate 100.

A top surface 100a of the semiconductor substrate 100 may have at least one plane included in a {100} family of planes of the crystal structure of the semiconductor substrate 100. A (100) plane, a (−100) plane, a (010) plane, a (0-10) plane, a (001) plane, and a (00-1) plane of the crystal structure of the semiconductor substrate 100 may be included in the {100} family of planes of the crystal structure of the semiconductor substrate 100 and may be crystallographically equivalent to each other. Hereinafter, as illustrated in FIGS. 1A and 1B, embodiments will be described using the top surface 100a, having the (001) plane, of the semiconductor substrate 100 as an example. The (001) plane may be a representative plane of the {100} family of planes and/or may be substantially equivalent to other planes of the {100} family of planes.

The semiconductor substrate 100 may include a trench T formed in an upper portion thereof. The trench T may include an inner sidewall T_S that has one plane included in a {320} family of planes of the crystal structure of the semiconductor substrate 100 or one plane similar to the {320} family of planes of the crystal structure of the semiconductor substrate 100. Herein, an "A crystal plane" being similar to a "B crystal plane" indicates that an angle between the "A crystal plane" and the "B crystal plane" is smaller than about 2 degrees. The {320} family of planes of the crystal structure of the semiconductor substrate 100 may include a (320) plane, a (−320) plane, a (3-20) plane, a (−3-20) plane, a (230) plane, a (−230) plane, a (2-30) plane, a (−2-30) plane, a (302) plane, a (−302) plane, a (30-2) plane, a (−30-2) plane, a (203) plane, a (−203) plane, a (20-3) plane, a (−20-3) plane, a (032) plane, a (0-32) plane, a (03-2) plane, a (0-3-2) plane, a (023) plane, a (0-23) plane, a (02-3) plane, and a (0-2-3) plane of the crystal structure of the semiconductor substrate 100, which are crystallographically equivalent to each other. In an implementation, the inner sidewall T_S of the trench T may be substantially perpendicular to the top surface 100a of the semiconductor substrate 100. When the top surface 100a of the semiconductor substrate 100 has the (001) plane, the inner sidewall T_S of the trench T may have the (320) plane, the (−320) plane, the (3-20) plane, the (−3-20) plane, the (230) plane, the (−230) plane, the (2-30) plane, or the (−2-30) plane. Hereinafter, as illustrated in FIGS. 1A and 1B, embodiments will be described using the inner sidewall T_S, having the (320) plane, of the trench T as an example. The (320) plane may be a representative plane of the (320) plane, the (−320) plane, the (3-20) plane, the (−3-20) plane, the (230) plane, the (−230) plane, the (2-30) plane, and the (−2-30) plane and/or may be substantially equivalent to other planes thereof.

In some embodiments, the trench T may extend in a direction substantially parallel to one direction included in a <230> family of directions of the crystal structure of the semiconductor substrate 100 when viewed in a plan view. As illustrated in FIGS. 1A and 1B, according to the embodiment in which the inner sidewall T_S of the trench T has the (320) plane, the trench T may extend in a direction substantially parallel to a [−230] direction or a [2-30] direction of the crystal structure of the semiconductor substrate 100. In an implementation, a bottom surface T_B of the trench T may be flat, as illustrated in FIG. 1B. In another implementation, the bottom surface T_B of the trench T may have a downward concave shape different from the flat shape of FIG. 1B.

An insulating layer 110 may be provided on the inner sidewall T_S of the trench T. In some embodiments, the insulating layer 110 may extend to cover the bottom surface T_B of the trench T, as illustrated in FIGS. 1A and 1B. For example, the insulating layer 110 may include at least one of a silicon oxide layer or a silicon oxynitride layer.

The insulating layer 110 may be in contact with the inner sidewall T_S of the trench T, and thus an interface may be formed between the inner sidewall T_S of the trench T and the insulating layer 110. A periodicity of the crystal structure of the semiconductor substrate 100 (or the arrangement of semiconductor atoms included in the semiconductor substrate 100) may be broken at the interface between the inner sidewall T_S of the trench T and the insulating layer 110. Thus, interface traps could be generated at the interface between the inner sidewall T_S of the trench T and the insulating layer 110.

Figure 2A:
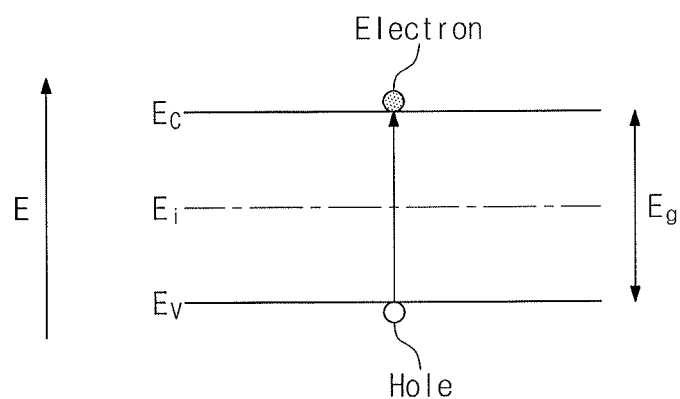
FIG. 2A illustrates an energy band diagram of a semiconductor not including an interface trap.
Figure 2B:
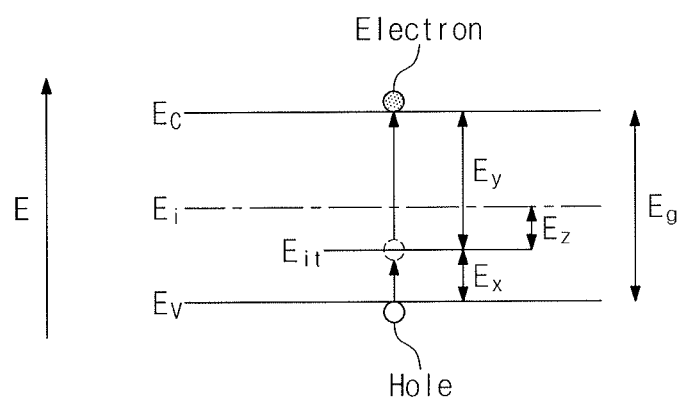
FIGS. 2B and 2C illustrate energy band diagrams of semiconductors including interface traps.
Figure 2C:
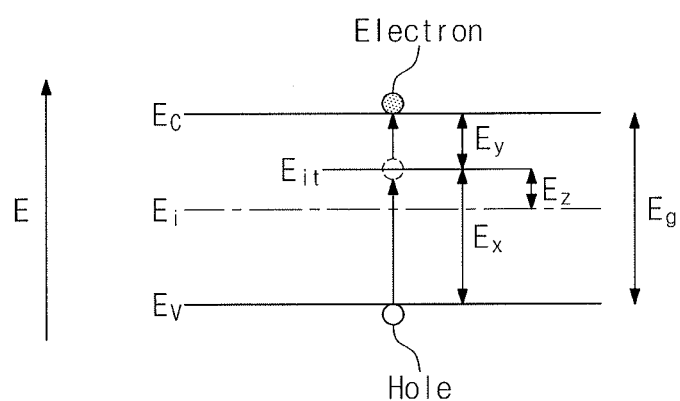

FIG. 2A illustrates an energy band diagram of a semiconductor not including an interface trap. FIGS. 2B and 2C illustrate energy band diagrams of semiconductors including interface traps. In FIGS. 2A to 2C, a designator $E_c$ denotes the minimum energy level of a conduction band, a designator $E_v$ denotes the maximum energy level of a valence band, a designator $E_g$ denotes an energy band gap, and a designator $E_i$ denotes an intrinsic Fermi level. The intrinsic Fermi level $E_i$ of a semiconductor may be substantially equal to an average value of the minimum energy level $E_c$ of the conduction band and the maximum energy level $E_v$ of the valence band ($E_i \approx (E_c+E_v)/2$). For example, the intrinsic Fermi level $E_i$ may be disposed at a substantial center of the energy band gap $E_g$ ($E_i \approx E_v+E_g/2$, or $E_i \approx E_c-E_g/2$).

Referring to FIG. 2A, the minimum energy necessary to generate an electron-hole pair (EHP) in a semiconductor not including an interface trap may be equal to the energy band gap $E_g$ ($E_g \approx E_c-E_v$). The energy band gap $E_g$ may be changed according to a kind and/or a temperature of a semiconductor material. For example, an energy band gap $E_g$ of silicon may be about 1.12 eV at a room or ambient temperature (about 300K), and an energy band gap $E_g$ of germanium may be about 0.67 eV at the ambient temperature (about 300 K).

Referring to FIGS. 2B and 2C, an energy level $E_{it}$ (hereinafter, referred to as 'an interface trap energy level') allowed in the energy band gap $E_g$ may exist ($E_v<E_{it}<E_c$). In this case, the electron-hole pair may be generated through the interface trap energy level $E_{it}$. For example, an electron of the valence band may be excited to the interface trap energy level $E_{it}$ and then may be excited to the conduction band, thereby generating the electron-hole pair.

Energy necessary to generate the electron-hole pair by this excitation process may be lower than energy necessary to generate an electron-hole pair in the semiconductor not including the interface trap (see FIG. 2A). For example, the minimum energy necessary to generate an electron-hole pair in a semiconductor including the interface trap may be equal to the greater of the minimum energy $E_x$ ($E_x=E_{it}-E_v$) necessary to excite an electron of the valence band to the interface trap energy level $E_{it}$ and the minimum energy $E_y$ ($E_y=E_c-E_{it}$) necessary to excite an electron of the interface trap energy level $E_{it}$ to the conduction band.

In some embodiments, as illustrated in FIG. 2B, when the interface trap energy level $E_{it}$ is lower than the intrinsic Fermi level $E_i$ ($E_{it}<E_i$), the minimum energy necessary to generate the electron-hole pair may be equal to the minimum energy $E_y$ necessary to excite the electron of the interface trap energy level $E_{it}$ to the conduction band. In addition, the minimum energy necessary to generate the electron-hole pair may be substantially equal to a sum ($E_g/2+E_z$) of a difference $E_z$ ($E_z=|E_i-E_{it}|=E_i-E_{it}$) between the intrinsic Fermi level $E_i$ and the interface trap energy level $E_{it}$ and a half ($E_g/2$) of the energy band gap $E_g$ ($\because E_y=E_2+E_c-E_i \approx E_z+E_g/2$).

In certain embodiments, as illustrated in FIG. 2C, when the interface trap energy level $E_{it}$ is equal to or higher than the intrinsic Fermi level $E_i$ ($E_{it} \geq E_i$), the minimum energy necessary to generate the electron-hole pair may be equal to the minimum energy $E_x$ necessary to excite the electron of the valence band to the interface trap energy level $E_{it}$. In addition, the minimum energy necessary to generate the electron-hole pair may be substantially equal to a sum ($E_g/2+E_z$) of a difference $E_z$ ($E_z=|E_i-E_{it}|=E_{it}-E_i$) between the intrinsic Fermi level $E_i$ and the interface trap energy level $E_{it}$ and the half ($E_g/2$) of the energy band gap $E_g$ ($\because E_y=E_i-E_v+E_z \approx E_g/2+E_z$).

As a result, the energy generating the electron-hole pair in the semiconductor including the interface trap may be lower than the energy generating the electron-hole pair in the semiconductor not including the interface trap. For example, the electron-hole pairs may be more easily generated at the interface of the semiconductor substrate. These electron-hole pairs may cause a leakage current. For example, the leakage current may easily occur at the interface of the semiconductor substrate.

In this point of view, the generation of the electron-hole pair at the interface and the leakage current at the interface may be inhibited by reducing a two-dimensional interface trap concentration (i.e., the number of interface traps per unit area) or by increasing the minimum energy necessary to generate the electron-hole pair. As described above, when the interface trap exists, the minimum energy necessary to generate the electron-hole pair may be substantially equal to the sum ($E_g/2+E_z$) of the difference $E_z$ between the intrinsic Fermi level $E_i$ and the interface trap energy level $E_{it}$ and the half ($E_g/2$) of the energy band gap $E_g$. Thus, as the difference $E_z$ between the intrinsic Fermi level $E_i$ and the interface trap energy level $E_{it}$ is increased, the minimum energy necessary to generate the electron-hole pair may increase and the occurrence of the leakage current may be difficult.

The two-dimensional interface trap concentration and the difference $E_z$ between the intrinsic Fermi level $E_i$ and the interface trap energy level $E_{it}$ may correspond to two factors that affect the occurrence of the leakage current at the interface (or the generation of the electron-hole pair at the interface). The two-dimensional interface trap concentration and the difference $E_z$ between the intrinsic Fermi level $E_i$ and the interface trap energy level $E_{it}$ may be changed according to a crystal plane of the interface.

Figure 3:
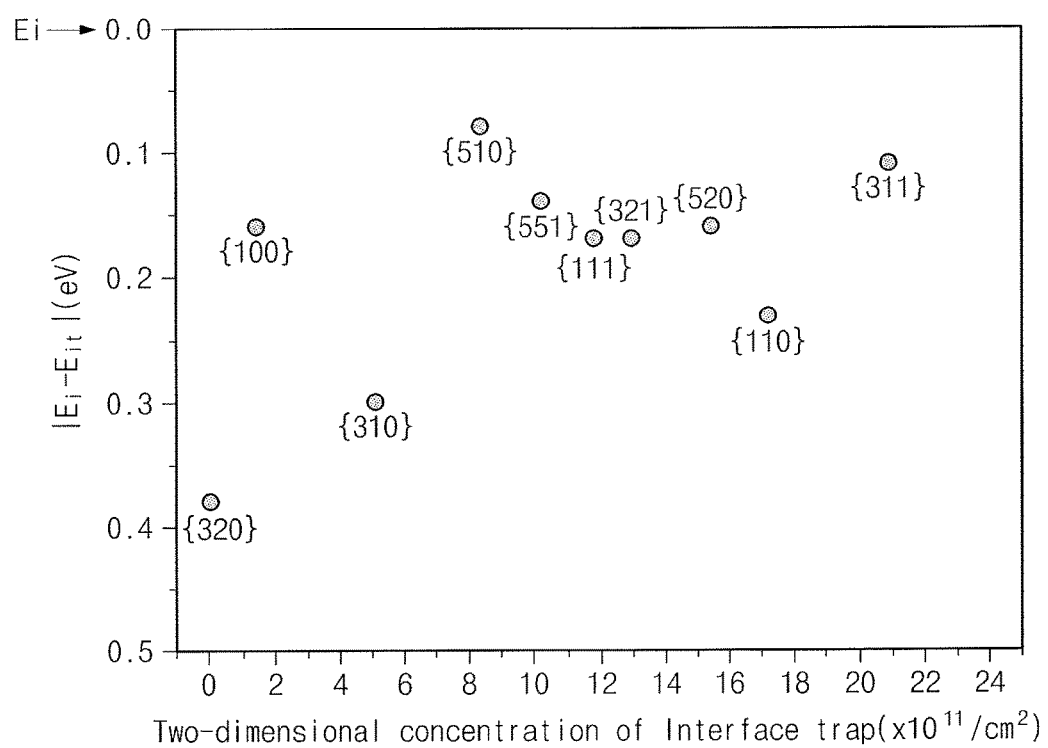
FIG. 3 illustrates a graph of two-dimensional interface trap concentrations and differences between intrinsic Fermi levels and interface trap energy levels at inner sidewalls having different crystal planes from each other obtained by computer simulation.

FIG. 3 illustrates a graph of two-dimensional interface trap concentrations and differences ($E_z$ of FIGS. 2A and 2B) between an intrinsic Fermi level and interface trap energy levels at inner sidewalls having different crystal planes from each other.

Trenches respectively including inner sidewalls having different crystal planes from each other are formed in a single-crystalline silicon substrate, and a silicon oxide layer is formed on the inner sidewalls to form interfaces between the silicon oxide layer and the inner sidewalls. Thereafter, measurement processes are performed to measure a two-dimensional interface trap concentration and a difference between an intrinsic Fermi level and an interface trap energy level of each of the inner sidewalls.

As illustrated in FIG. 3, the two-dimensional interface trap concentration is low at the inner sidewall having at least one plane included in a {320} family of planes, and the difference between the intrinsic Fermi level and the interface trap energy level is great at the inner sidewall having at least one plane included in the {320} family of planes. For example, the two-dimensional interface trap concentration is about $1.72 \times 10^{12}/cm^2$ at the inner sidewall having at least one plane of a {110} family of planes, and the difference between the intrinsic Fermi level and the interface trap energy level is about 0.222 eV at the inner sidewall having at least one plane of the {110} family of planes. In contrast, the two-dimensional interface trap concentration is about $7.35 \times 10^9/cm^2$ at the inner sidewall having at least one plane of the {320} family of planes, and the difference between the intrinsic Fermi level and the interface trap energy level is about 0.374 eV at the inner sidewall having at least one plane of the {320} family of planes.

For example, when the interface of the single-crystalline silicon substrate has at least one plane of the {320} family of planes or at least one plane similar to the {320} family of planes, the generation of the electron-hole pair may be inhibited at the interface and the leakage current may be reduced or inhibited. The interface characteristics may be due to band gap characteristics and a crystal structure of a semiconductor, and the aforementioned interface characteristics may also be shown at an interface of another semiconductor material (e.g., germanium) having the substantially same crystal structure (e.g., the diamond crystal structure) as silicon.

Referring again to FIGS. 1A and 1B, the inner sidewall T_S of the trench T may have at least one plane of the {320} family of planes or at least one plane similar to the {320} family of planes in the semiconductor device according to some embodiments. Thus, the two-dimensional interface trap concentration may be low at the interface between the insulating layer 110 and the inner sidewall T_S of the trench T, and the difference between the intrinsic Fermi level and the interface trap energy level may be great at the interface between the insulating layer 110 and the inner sidewall T_S of the trench T. As a result, it is possible to inhibit the leakage current from occurring at the inner sidewall T_S of the trench T in the semiconductor device according to some embodiments.

Figure 4A:
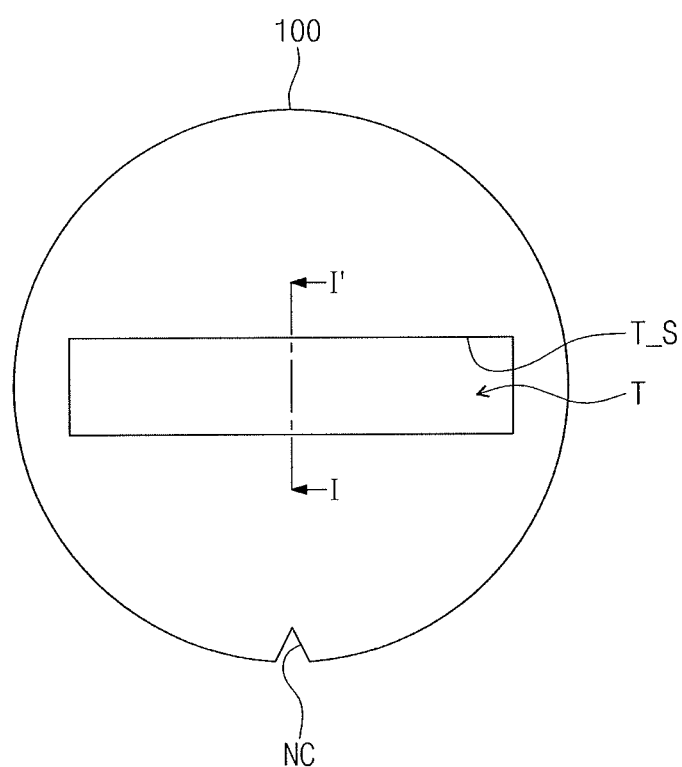
FIGS. 4A and 5A illustrate plan views of stages in a method for manufacturing a semiconductor device according to some embodiments.
Figure 4A:
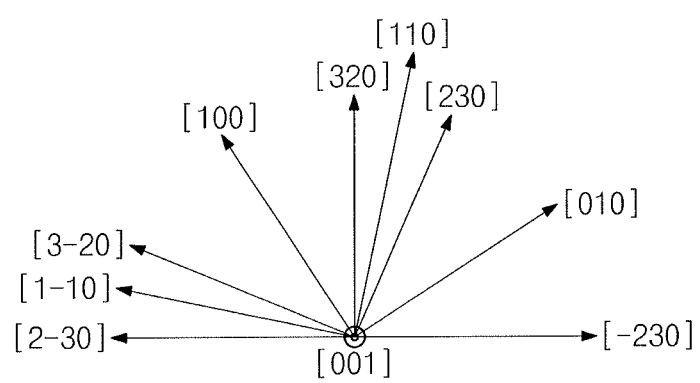
Figure 4B:
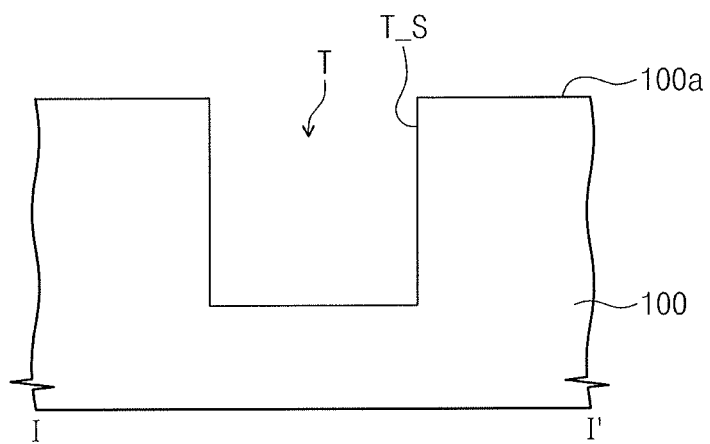
FIGS. 4B and 5B illustrate cross-sectional views taken along lines I-I' of FIGS. 4A and 5A, respectively.
Figure 4B:
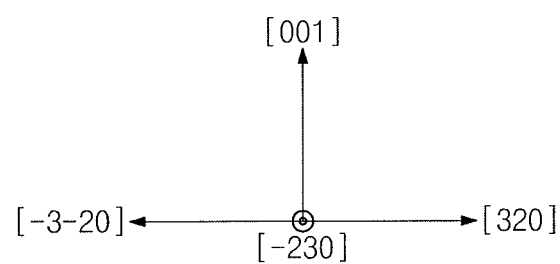
Figure 5A:
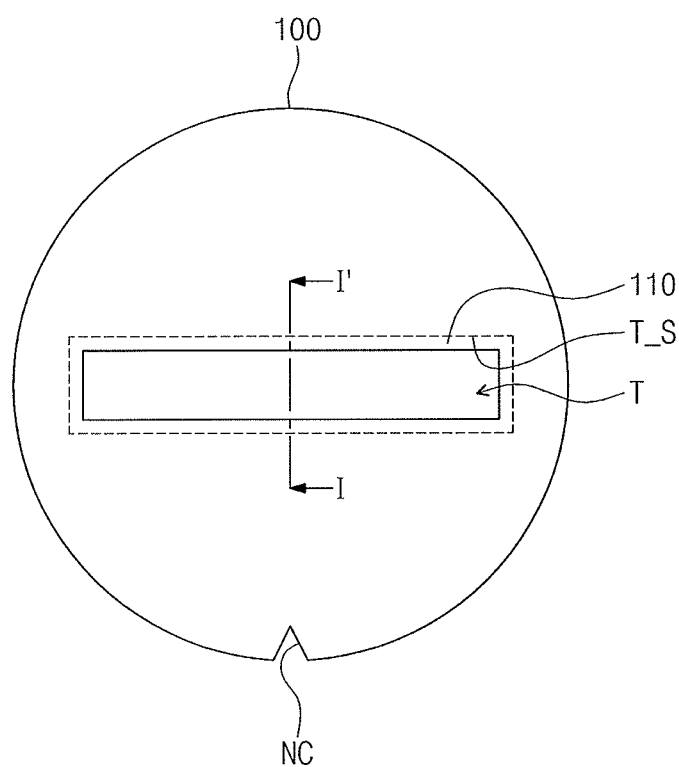
Figure 5A:
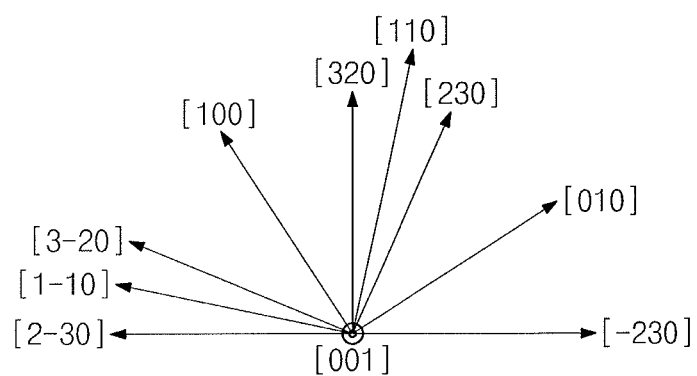
Figure 5B:
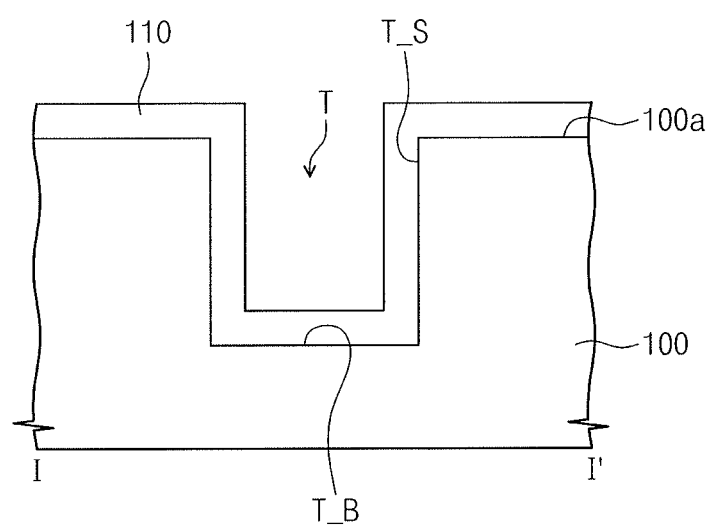
Figure 5B:
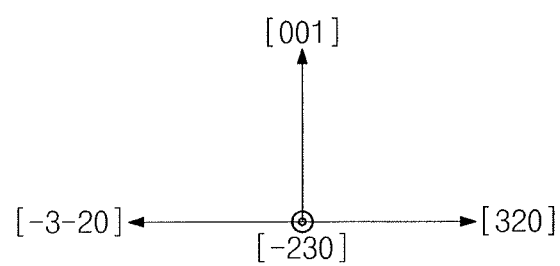

FIGS. 4A and 5A illustrate plan views of stages in a method for manufacturing a semiconductor device according to some embodiments. FIGS. 4B and 5B illustrate cross-sectional views taken along lines I-I' of FIGS. 4A and 5A, respectively. Hereinafter, the same components as described with reference to FIGS. 1A and 1B will be indicated by the same reference numerals or the same reference designators, and repeated descriptions thereof may be omitted or mentioned briefly for the purpose of ease and convenience in explanation.

Referring to FIGS. 4A and 4B, a semiconductor substrate 100 may be provided.

The semiconductor substrate 100 may have a crystal structure of a cubic system. For example, the semiconductor substrate 100 may have a diamond crystal structure. For example, the semiconductor substrate 100 may be a silicon wafer. A top surface 100a of the semiconductor substrate 100 may have at least one plane included in a {100} family of planes of the crystal structure of the semiconductor substrate 100. Hereinafter, as illustrated in FIGS. 1A and 1B, embodiments will be described using the top surface 100a, having the (001) plane, of the semiconductor substrate 100 as an example.

In some embodiments, the semiconductor substrate 100 may include a notch NC. The notch NC may be used to show a direction of the crystal structure of the semiconductor substrate 100. The notch NC may face one direction included in a <320> family of directions of the crystal structure of the semiconductor substrate 100. For example, as illustrated in FIG. 4A, the notch NC may be formed in a [320] direction of the crystal structure of the semiconductor substrate 100.

In certain embodiments, the semiconductor substrate 100 may include a flat zone instead of the notch NC illustrated in FIG. 4A. Like the notch NC, the flat zone may be used to show a direction of the crystal structure of the semiconductor substrate 100. When the semiconductor substrate 100 includes the flat zone, the flat zone may have one plane included in a {320} family of planes of the crystal structure of the semiconductor substrate 100.

A trench T extending in one direction may be formed in an upper portion of the semiconductor substrate 100. The trench T may include an inner sidewall T_S that has one plane included in the {320} family of planes of the crystal structure of the semiconductor substrate 100 or one plane similar to the {320} family of planes of the crystal structure of the semiconductor substrate 100. Hereinafter, the inner sidewall T_S of the trench T, which has a (320) plane as illustrated in FIGS. 4A and 4B, will be described as an example.

In some embodiments, the trench T may extend in a direction substantially parallel to one direction included in a <230> family of directions of the crystal structure of the semiconductor substrate 100 when viewed in a plan view. As illustrated in FIGS. 4A and 4B, according to the embodiment in which the inner sidewall T_S of the trench T has the (320) plane, the trench T may extend in the direction substantially parallel to a [−230] direction or a [2-30] direction of the crystal structure of the semiconductor substrate 100. In some embodiments, a mask pattern may be formed on the semiconductor substrate 100, and the semiconductor substrate 100 may be anisotropically etched using the mask pattern as an etch mask to form the trench T.

Referring to FIGS. 5A and 5B, an insulating layer 110 may be formed to cover the inner sidewall T_S of the trench T. In some embodiments, the insulating layer 110 may extend to cover a bottom surface T_B of the trench T, as illustrated in FIGS. 5A and 5B. The insulating layer 110 may be in contact with the inner sidewall T_S of the trench T. An interface may be formed between the inner sidewall T_S of the trench T and the insulating layer 110. The periodicity of the crystal structure of the semiconductor substrate 100 (or the arrangement of semiconductor atoms included in the semiconductor substrate 100) may be broken at the interface between the inner sidewall T_S of the trench T and the insulating layer 110. Thus, interface traps may be generated at the interface between the inner sidewall T_S of the trench T and the insulating layer 110. The insulating layer 110 may be formed using, e.g., a thermal oxidation process, a chemical vapor deposition (CVD) process, or a physical vapor deposition (PVD) process.

As described with reference to FIGS. 2A to 2C and 3, the two-dimensional interface trap concentration may be low at the inner sidewall having at least one plane of the {320} family of planes or at least one plane similar to the {320} family of planes, and the difference between the intrinsic Fermi level and the interface trap energy level may be great at the inner sidewall having at least one plane of the {320} family of planes or at least one plane similar to the {320} family of planes. In the semiconductor device according to some embodiments, the inner sidewall T_S of the trench T may have at least one plane of the {320} family of planes or at least one plane similar to the {320} family of planes. Thus, the two-dimensional interface trap concentration may be low at the interface between the insulating layer 110 and the inner sidewall T_S of the trench T, and the difference between the intrinsic Fermi level and the interface trap energy level may be great at the interface between the insulating layer 110 and the inner sidewall T_S of the trench T. As a result, it is possible to inhibit the leakage current from occurring at the inner sidewall T_S of the trench T in the semiconductor device according to some embodiments.

Figure 6A:
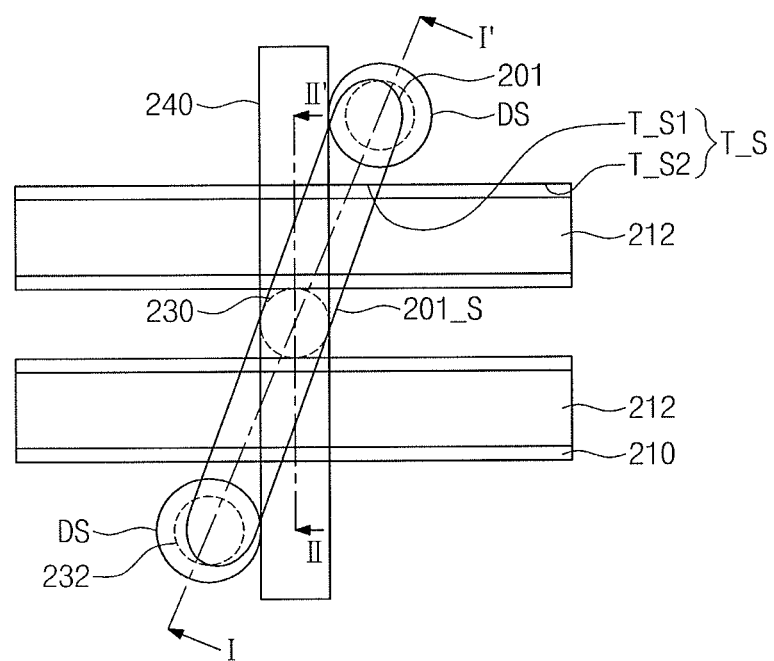
FIG. 6A illustrates a plan view of a semiconductor device according to some embodiments.
Figure 6A:
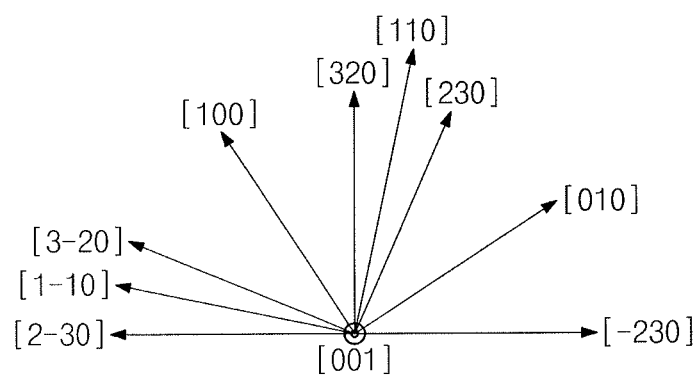
Figure 6B:
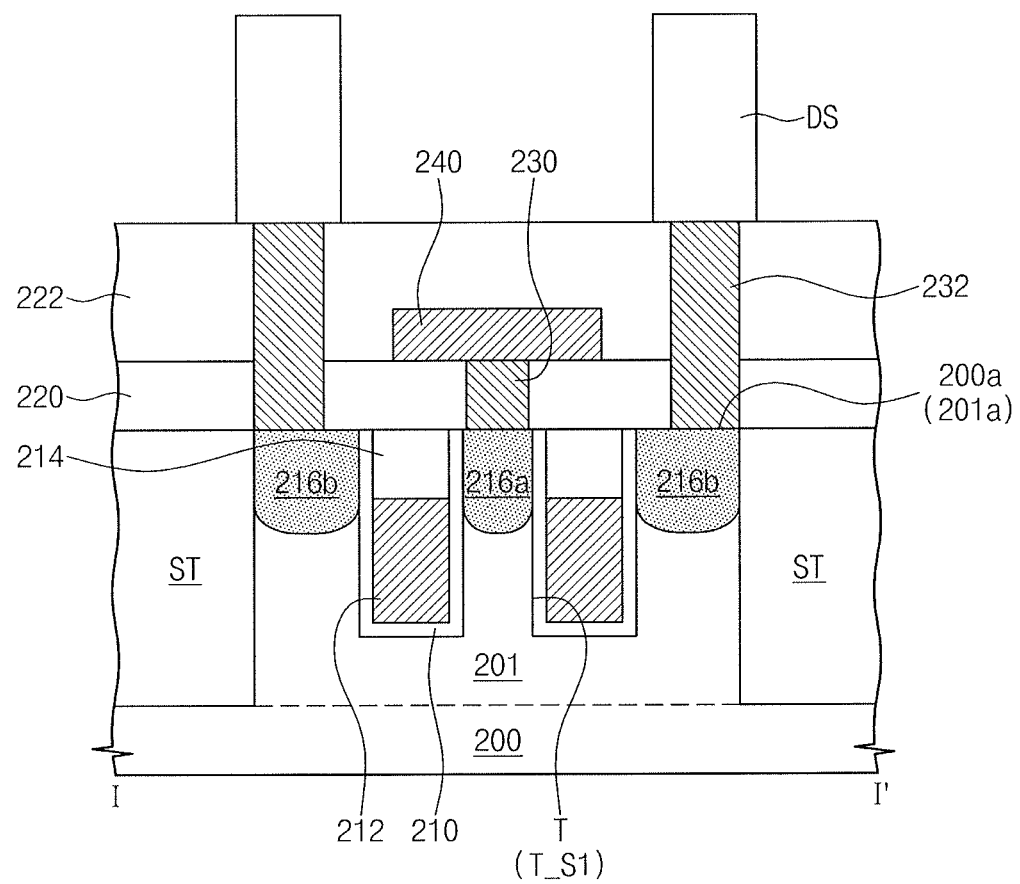
FIG. 6B illustrates a cross-sectional view taken along a line I-I' of FIG. 6A.
Figure 6C:
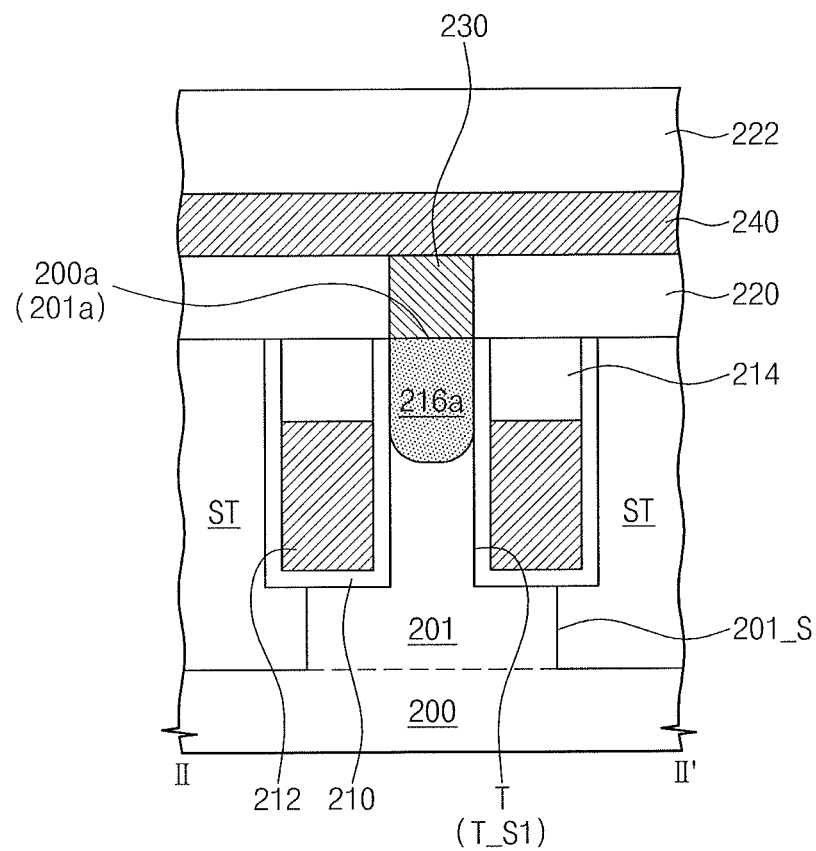
FIG. 6C illustrates a cross-sectional view taken along a line II-II' of FIG. 6A.
Figure 6C:
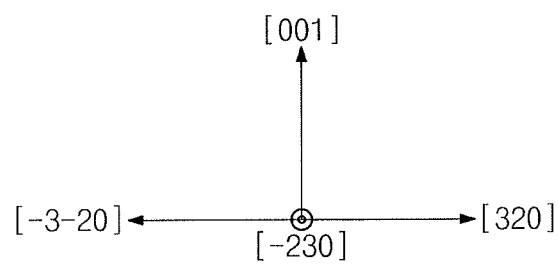

FIG. 6A illustrates a plan view of a semiconductor device according to some embodiments. FIG. 6B illustrates a cross-sectional view taken along a line I-I' of FIG. 6A. FIG. 6C illustrates a cross-sectional view taken along a line II-II' of FIG. 6A.

Referring to FIGS. 6A to 6C, a semiconductor substrate 200 may be provided. The semiconductor substrate 200 may have a crystal structure of a cubic system. For example, the semiconductor substrate 200 may have a diamond crystal structure. For example, the semiconductor substrate 200 may include single-crystalline silicon or single-crystalline germanium.

A top surface 200a of the semiconductor substrate 200 may have at least one plane included in a {100} family of planes of the crystal structure of the semiconductor substrate 200. A (100) plane, a (−100) plane, a (010) plane, a (0-10) plane, a (001) plane, and a (00-1) plane of the crystal structure of the semiconductor substrate 200 may be included in the {100} family of planes of the crystal structure of the semiconductor substrate 200 and may be crystallographically equivalent to each other. Hereinafter, the top surface 200a of the semiconductor substrate 200, which has the (001) plane as illustrated in FIGS. 6A to 6C, will be described as an example.

A device isolation layer ST may be provided in the semiconductor substrate 200 to define an active region 201. The active region 201 may correspond to a portion the semiconductor substrate 200 that is surrounded by the device isolation layer ST in a plan view. For example, the device isolation layer ST may include at least one of a silicon oxide layer or a silicon oxynitride layer.

A pair of trenches T may be provided in the semiconductor substrate 200 to intersect the active region 201 and the device isolation layer ST. An inner sidewall T_S of each of the trenches T may include a first inner sidewall T_S1 defined by a portion of the active region 201 and a second inner sidewall T_S2 defined by a portion of the device isolation layer ST. The first inner sidewall T_S1 of each of the trenches T may have at least one plane included in a {320} family of planes of the crystal structure of the semiconductor substrate 200 or at least one plane similar to the {320} family of planes of the crystal structure of the semiconductor substrate 200. The {320} family of planes of the crystal structure of the semiconductor substrate 200 may include a (320) plane, a (−320) plane, a (3-20) plane, a (−3-20) plane, a (230) plane, a (−230) plane, a (2-30) plane, a (−2-30) plane, a (302) plane, a (−302) plane, a (30-2) plane, a (−30-2) plane, a (203) plane, a (−203) plane, a (20-3) plane, a (−20-3) plane, a (032) plane, a (0-32) plane, a (03-2) plane, a (0-3-2) plane, a (023) plane, a (0-23) plane, a (02-3) plane, and a (0-2-3) plane of the crystal structure of the semiconductor substrate 200, which are crystallographically equivalent to each other. The first inner sidewall TS1 of the trench T may be substantially perpendicular to a top surface 201a of the active region 201 (or the top surface 200a of the semiconductor substrate 200). Thus, when the top surface 200a of the semiconductor substrate 200 has the (001) plane, the first inner sidewall T_S1 of the trench T may have the (320) plane, the (−320) plane, the (3-20) plane, the (−3-20) plane, the (230) plane, the (−230) plane, the (2-30) plane, or the (−2-30) plane. Hereinafter, as illustrated in FIGS. 6A to 6C, embodiments will be described using the first inner sidewall T_S1 having the (320) plane as an example.

In some embodiments, each of the trenches T may extend in a direction substantially parallel to one direction included in a <230> family of directions of the crystal structure of the semiconductor substrate 200 when viewed in a plan view. As illustrated in FIG. 6A, according to the embodiment in which the first inner sidewall T_S1 has the (320) plane, each of the trenches T may extend in a direction substantially parallel to a [−230] direction or a [2-30] direction of the crystal structure of the semiconductor substrate 200. In an implementation, bottom surfaces of the trenches T may be substantially flat, as illustrated in FIGS. 6B and 6C. In another implementation, the bottom surface of each of the trenches T may have a downward concave shape, different from the flat surface illustrated FIGS. 6B and 6C.

An insulating layer 210 may be provided to conformally cover an inner surface of each of the trenches T. For example, the insulating layer 210 may include at least one of a silicon oxide layer or a silicon oxynitride layer.

The insulating layer 210 may be in contact with the inner sidewall T_S of each of the trenches T, and thus an interface may be formed between the first inner sidewall T_S1 of each of the trenches T and the insulating layer 210. The periodicity of the crystal structure of the semiconductor substrate 200 (or the arrangement of semiconductor atoms included in the semiconductor substrate 200) may be broken at the interface between the first inner sidewall T_S1 of each of the trenches T and the insulating layer 210. Thus, interface traps may be generated at the interface between the first inner sidewall T_S1 of the trench T and the insulating layer 210.

As described with reference to FIGS. 2A to 2C and 3, the two-dimensional interface trap concentration may be low at the inner sidewall having at least one plane of the {320} family of planes or at least one plane similar to the {320} family of planes, and the difference between the intrinsic Fermi level and the interface trap energy level may be great at the inner sidewall having at least one plane of the {320} family of planes or at least one plane similar to the {320} family of planes. According to some embodiments, the first inner sidewall T_S1 of each of the trenches T may have at least one plane included in the {320} family of planes or at least one plane similar to the {320} family of planes. Thus, the two-dimensional interface trap concentration may be low at the interface between the insulating layer 210 and the first inner sidewall TS1 of the trench T, and the difference between the intrinsic Fermi level and the interface trap energy level may be great at the interface between the insulating layer 210 and the first inner sidewall T_S1 of the trench T. As a result, it is possible to inhibit a leakage current from occurring at the first inner sidewall T_S1 of each of the trenches T in the semiconductor device according to some embodiments.

In addition, the device isolation layer ST may be in contact with a sidewall of the active region 201, and thus an interface may be formed between the sidewall of the active region 201 and the device isolation layer ST. The periodicity of the crystal structure of the semiconductor substrate 200 may be broken at the interface between the sidewall of the active region 201 and the device isolation layer ST. Thus, interface traps may be generated at the interface between the sidewall of the active region 201 and the device isolation layer ST.

The active region 201 may have a rectangular shape (or a bar shape) having a long axis in one direction when viewed in a plan view. The one direction in which the active region 201 extends may be substantially parallel to a [230] direction of the crystal structure of the semiconductor substrate 200 or may be close or approximate to the [230] direction. For example, an angle between the extending direction (i.e., the one direction) of the active region 201 and the [230] direction of the crystal structure of the semiconductor substrate 200 may be smaller than about 2 degrees. An angle between the [230] direction and the [−230] direction of the crystal structure of the semiconductor substrate 200 is about 67.38 degrees. An angle between the extending direction of the active region 201 and the extending direction of each of the trenches T may range from about 65.38 degrees to about 69.38 degrees. Thus, a portion 201_S, extending in the extending direction of the active region 201, of the sidewall of the active region 201 may have the (3-20) plane of the crystal structure of the semiconductor substrate 200 or a similar plane to the (3-20) plane. An angle between the similar plane and the (3-20) plane may be smaller than about 2 degrees.

As described with reference to FIGS. 2A to 2C and 3, the two-dimensional interface trap concentration may be low at the interface having at least one plane of the {320} family of planes or at least one plane similar to the {320} family of planes, and the difference between the intrinsic Fermi level and the interface trap energy level may be great at the interface having at least one plane of the {320} family of planes or at least one plane similar to the {320} family of planes. As described above, the portion 201_S of the sidewall of the active region 201, which extends in the extending direction of the active region 201, may have the (3-20) plane of the crystal structure of the semiconductor substrate 200 or the similar plane to the (3-20) plane. Thus, the two-dimensional interface trap concentration may be low at the interface between the portion 201_S of the sidewall of the active region 201 and the device isolation layer ST, and the difference between the intrinsic Fermi level and the interface trap energy level may be great at the interface between the portion 201_S of the sidewall of the active region 201 and the device isolation layer ST. As a result, it is possible to inhibit a leakage current from occurring at the interface between the portion 201_S of the sidewall of the active region 201 and the device isolation layer ST in the semiconductor device according to some embodiments.

A word line 212 may be provided in each of the trenches T. The word line 212 may fill a lower portion of each of the trenches T. The insulating layer 210 may be disposed between the word line 212 and the active region 201. A gate hard mask pattern 214 may be disposed on the word line 212.

The word lines 212 may include at least one of a doped semiconductor material (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., a metal silicide). The gate hard mask pattern 214 may include at least one of an oxide (e.g., silicon oxide), a nitride (e.g., silicon nitride), or an oxynitride (e.g., silicon oxynitride).

Source and drain regions 216a and 216b may be formed in the active region 201 at both sides of each of the word lines 212. The source and drain regions 216a and 216b may be doped with N-type dopants or P-type dopants. Bottom surfaces of the source and drain regions 216a and 216b may be disposed at a specific depth from the top surface 201a of the active region 201. The source region 216a may be disposed in the active region 201 between a pair of the word lines 212. The drain regions 216b may be spaced apart from the source region 216a and may be disposed in the end portions of the active region 201, respectively.

A first interlayer insulating layer 220 may be provided to cover the active region 201 and the device isolation layer ST. For example, the first interlayer insulating layer 220 may include at least one of a silicon oxide layer, a silicon nitride layer, or a silicon oxynitride layer. A first contact plug 230 may penetrate the first interlayer insulating layer 220 so as to be electrically connected to the source region 216a. A bit line 240 may be provided on the first interlayer insulating layer 220 and may be electrically connected to the first contact plug 230. In some embodiments, the bit line 240 may extend in a direction substantially parallel to a [320] direction of the crystal structure of the semiconductor substrate 200 when viewed in a plan view.

A second interlayer insulating layer 222 may be provided on the first interlayer insulating layer 220 and the bit line 240. For example, the second interlayer insulating layer 222 may include at least one of a silicon oxide layer, a silicon nitride layer, or a silicon oxynitride layer. Second contact plugs 232 may penetrate the second and first interlayer insulating layers 222 and 220 so as to be electrically connected to the drain region 216b, respectively.

Data storage parts DS may be provided on the second interlayer insulating layer 222. The data storage parts DS may be connected to the second contact plugs 232, respectively. In some embodiments, each of the data storage parts DS may be an electrode included in a capacitor. In certain embodiments, each of the data storage parts DS may be a variable resistance pattern that is switchable between two resistive states by an electrical pulse applied to a memory element. For example, each of the data storage parts DS may include a phase-change material of which a crystal state is changed according to a current amount, a perovskite compound, a transition metal oxide, a magnetic material, a ferromagnetic material, and/or an anti-ferromagnetic material.

Figure 7A:
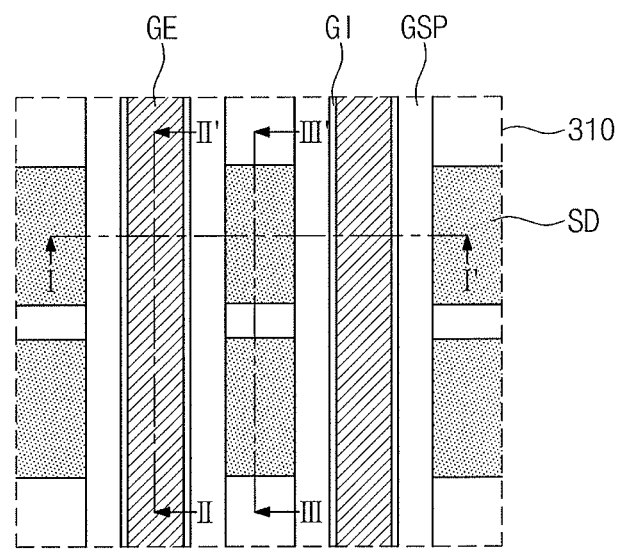
FIG. 7A illustrates a plan view of a semiconductor device according to some embodiments.
Figure 7A:
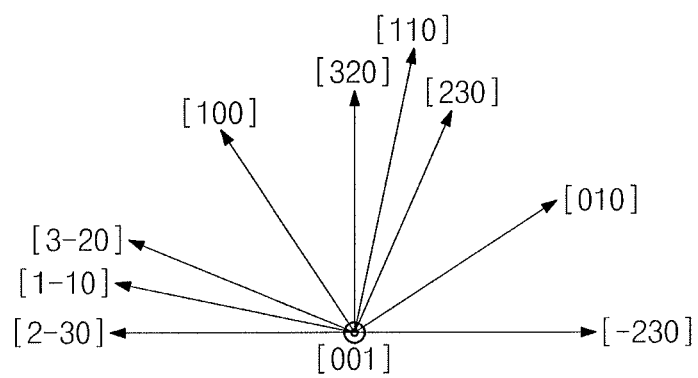
Figure 7B:
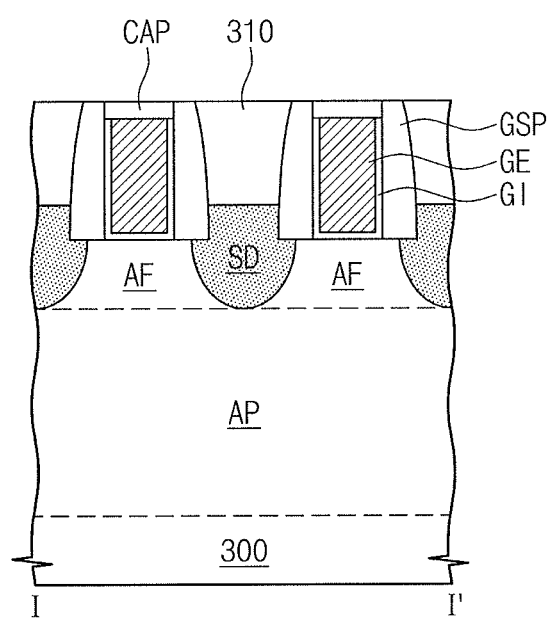
FIGS. 7B, 7C, and 7D illustrate cross-sectional views taken along lines I-I', II-II', and of FIG. 7A, respectively.
Figure 7B:
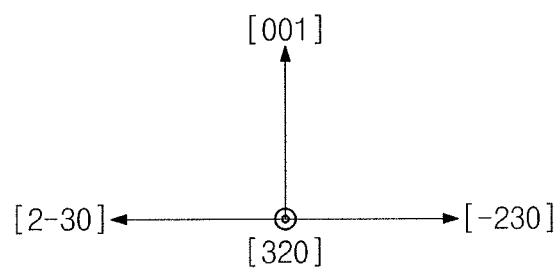
Figure 7C:
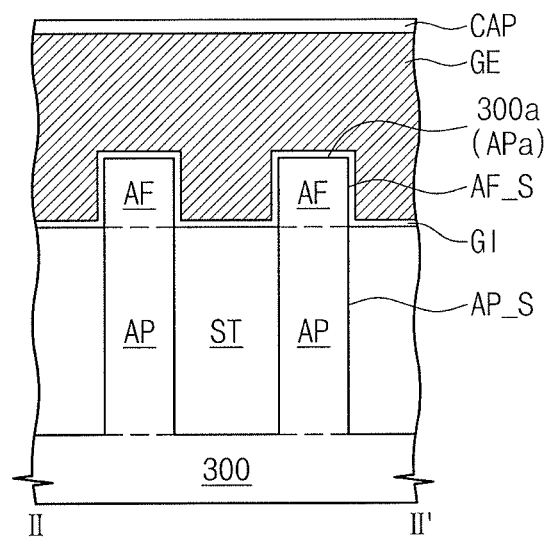
Figure 7C:
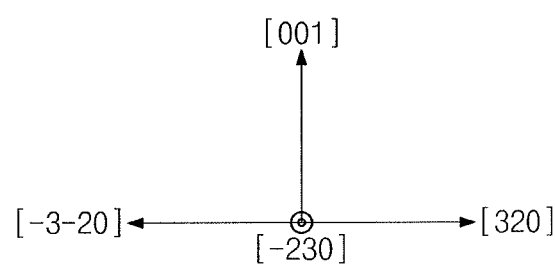
Figure 7D:
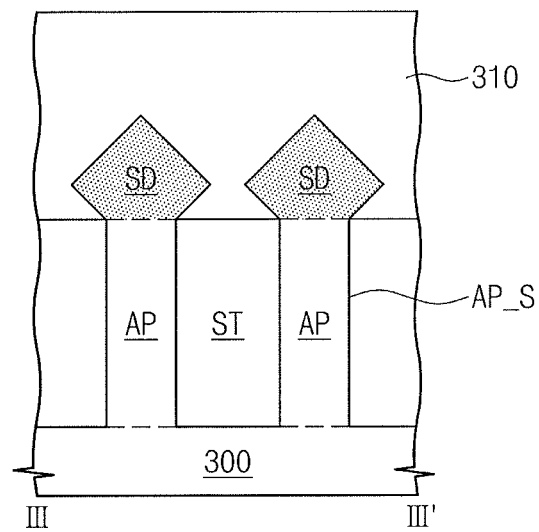
Figure 7D:
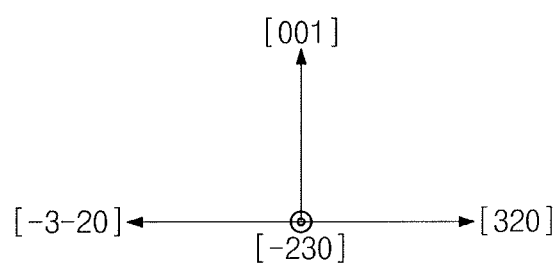

FIG. 7A illustrates a plan view of a semiconductor device according to some embodiments. FIGS. 7B, 7C, and 7D illustrate cross-sectional views taken along lines I-I', and of FIG. 7A, respectively.

Referring to FIGS. 7A to 7D, a semiconductor substrate 300 may be provided. The semiconductor substrate 300 may have a crystal structure of a cubic system. For example, the semiconductor substrate 300 may have a diamond crystal structure. For example, the semiconductor substrate 300 may include single-crystalline silicon or single-crystalline germanium.

A top surface 300a of the semiconductor substrate 300 may have at least one plane included in a {100} family of planes of the crystal structure of the semiconductor substrate 300. A (100) plane, a (−100) plane, a (010) plane, a (0-10) plane, a (001) plane, and a (00-1) plane of the crystal structure of the semiconductor substrate 300 may be included in the {100} family of planes of the crystal structure of the semiconductor substrate 300 and may be crystallographically equivalent to each other. Hereinafter, the top surface 300a of the semiconductor substrate 300, which has the (001) plane as illustrated in FIGS. 7A to 7D, will be described as an example.

A device isolation layer ST may be provided in the semiconductor substrate 300 to define an active pattern AP. For example, the device isolation layer ST may include at least one of a silicon oxide layer or a silicon oxynitride layer.

A sidewall AP_S of the active pattern AP may have at least one plane included in a {320} family of planes of the crystal structure of the semiconductor substrate 300 or at least one plane similar to the {320} family of planes of the crystal structure of the semiconductor substrate 300. The {320} family of planes of the crystal structure of the semiconductor substrate 300 may include a (320) plane, a (−320) plane, a (3-20) plane, a (−3-20) plane, a (230) plane, a (−230) plane, a (2-30) plane, a (−2-30) plane, a (302) plane, a (−302) plane, a (30-2) plane, a (−30-2) plane, a (203) plane, a (−203) plane, a (20-3) plane, a (−20-3) plane, a (032) plane, a (0-32) plane, a (03-2) plane, a (0-3-2) plane, a (023) plane, a (0-23) plane, a (02-3) plane, and a (0-2-3) plane of the crystal structure of the semiconductor substrate 300, which are crystallographically equivalent to each other. In an implementation, the sidewall AP_S of the active pattern AP may be substantially perpendicular to the top surface 300a of the semiconductor substrate 300 (or a top surface APa of the active pattern AP). Thus, when the top surface 300a of the semiconductor substrate 300 has the (001) plane, the sidewall AP_S of the active pattern AP may have the (320) plane, the (−320) plane, the (3-20) plane, the (−3-20) plane, the (230) plane, the (−230) plane, the (2-30) plane, or the (−2-30) plane. Hereinafter, the sidewall AP_S of the active pattern AP, which has the (320) plane as illustrated in FIGS. 7A to 7D, will be described as an example.

In some embodiments, the active pattern AP may extend in a direction substantially parallel to one direction included in a <230> family of directions of the crystal structure of the semiconductor substrate 300 when viewed in a plan view. As illustrated in FIGS. 7A to 7D, according to the embodiment in which the sidewall AP_S of the active pattern AP has the (320) plane, the active pattern AP may extend in a direction substantially parallel to a [−230] direction or a [2-30] direction of the crystal structure of the semiconductor substrate 300.

The sidewall AP_S of the active pattern AP may be in contact with the device isolation layer ST, and thus an interface may be formed between the sidewall AP_S of the active pattern AP and the device isolation layer ST. The periodicity of the crystal structure of the semiconductor substrate 300 (or the arrangement of semiconductor atoms included in the semiconductor substrate 300) may be broken at the interface between the sidewall AP_S of the active pattern AP and the device isolation layer ST. Thus, interface traps may be generated at the interface between the sidewall AP_S of the active pattern AP and the device isolation layer ST.

As described with reference to FIGS. 2A to 2C and 3, the two-dimensional interface trap concentration may be low at the sidewall having at least one plane of the {320} family of planes or at least one plane similar to the {320} family of planes, and the difference between the intrinsic Fermi level and the interface trap energy level may be great at the sidewall having at least one plane of the {320} family of planes or at least one plane similar to the {320} family of planes. According to some embodiments, the sidewall AP_S of the active pattern AP may have at least one plane of the {320} family of planes of the crystal structure of the semiconductor substrate 300 or at least one plane similar to the {320} family of planes of the crystal structure of the semiconductor substrate 300. Thus, the two-dimensional interface trap concentration may be low at the interface between the sidewall AP_S of the active pattern AP and the device isolation layer ST, and the difference between the intrinsic Fermi level and the interface trap energy level may be great at the interface between the sidewall AP_S of the active pattern AP and the device isolation layer ST. As a result, it is possible to inhibit a leakage current from occurring at the interface between the sidewall AP_S of the active pattern AP and the device isolation layer ST in the semiconductor device according to some embodiments.

The active pattern AP may have an upper portion (hereinafter, referred to as 'an active fin AF') exposed by the device isolation layer ST. A sidewall AF_S of the active fin AF may be a portion of the sidewall AP_S of the active pattern AP. Thus, the sidewall AF_S of the active fin AF may have the (320) plane (or another plane of the {320} family of planes) of the crystal structure of the semiconductor substrate 300.

Gate electrodes GE may be provided on the active pattern AP and may intersect the active pattern AP. In some embodiments, the gate electrodes GE may extend in a direction substantially parallel to a [320] direction of the crystal structure of the semiconductor substrate 300 when viewed in a plan view.

A gate insulating layer GI may be provided under each of the gate electrodes GE, and a capping pattern CAP may be provided on a top surface of each of the gate electrodes GE. Gate spacers GSP may be provided on both sidewalls of each of the gate electrodes GE. In some embodiments, the gate insulating layer GI may extend between each of the gate electrodes GE and the gate spacers GSP.

For example, the gate electrodes GE may include at least one of a doped semiconductor material, a metal, or a conductive metal nitride. For example, the gate insulating layer GI may include at least one of silicon oxide or silicon oxynitride. For example, each of the capping pattern CAP and the gate spacer GSP may include at least one of silicon oxide, silicon nitride, silicon oxynitride, silicon carbonitride (SiCN), or silicon-carbon oxynitride (SiCON).

The gate insulating layer GI may be in contact with the sidewall AF_S of the active fin AF, and thus an interface may be formed between the gate insulating layer GI and the sidewall AF_S of the active fin AF. The periodicity of the crystal structure of the semiconductor substrate 300 (or the arrangement of semiconductor atoms included in the semiconductor substrate 300) may be broken at the interface between the gate insulating layer GI and the sidewall AF_S of the active fin AF. Thus, interface traps may be generated at the interface between the gate insulating layer GI and the sidewall AF_S of the active fin AF.

As described with reference to FIGS. 2A to 2C and 3, the two-dimensional interface trap concentration may be low at the sidewall having at least one plane of the {320} family of planes or at least one plane similar to the {320} family of planes, and the difference between the intrinsic Fermi level and the interface trap energy level may be great at the sidewall having at least one plane of the {320} family of planes or at least one plane similar to the {320} family of planes. According to some embodiments, the sidewall AF_S of the active fin AF may have at least one plane of the {320} family of planes of the crystal structure of the semiconductor substrate 300 or at least one plane similar to the {320} family of planes of the crystal structure of the semiconductor substrate 300. Thus, the two-dimensional interface trap concentration may be low at the interface between the sidewall AF_S of the active fin AF and the gate insulating layer GI, and the difference between the intrinsic Fermi level and the interface trap energy level may be great at the interface between the sidewall AF_S of the active fin AF and the gate insulating layer GI. As a result, it is possible to inhibit a leakage current from occurring at the interface between the sidewall AF_S of the active fin AF and the gate insulating layer GI in the semiconductor device according to some embodiments.

Source/drain regions SD may be provided on or in the active pattern AP at both sides of each of the gate electrodes GE.

In some embodiments, as illustrated in FIGS. 7A to 7D, each of the source/drain regions SD may include an epitaxial pattern grown using the active pattern AP as a seed. In these embodiments, the active pattern AP may have recess regions disposed at both sides of the gate electrode GE, and the source/drain regions SD may be provided in the recess regions, respectively.

In certain embodiments, unlike FIGS. 7A to 7D, the source/drain regions SD may be dopant regions provided in the active fin AF at both sides of the gate electrode GE.

Portions of the active pattern AP (e.g., portions of the active fin AF) disposed under the gate electrodes GE may be used as channel regions. The channel regions may overlap with the gate electrodes GE when viewed in a plan view.

An interlayer insulating layer 310 may be provided on the semiconductor substrate 300. The interlayer insulating layer 310 may cover the device isolation layer ST, the active pattern AP, and the source/drain regions SD. In an implementation, a top surface of the interlayer insulating layer 310 may be substantially coplanar with top surfaces of the capping patterns CAP. In an implementation, the interlayer insulating layer 310 may include at least one of a silicon oxide layer, a silicon nitride layer, or a silicon oxynitride layer.

Figure 8A:
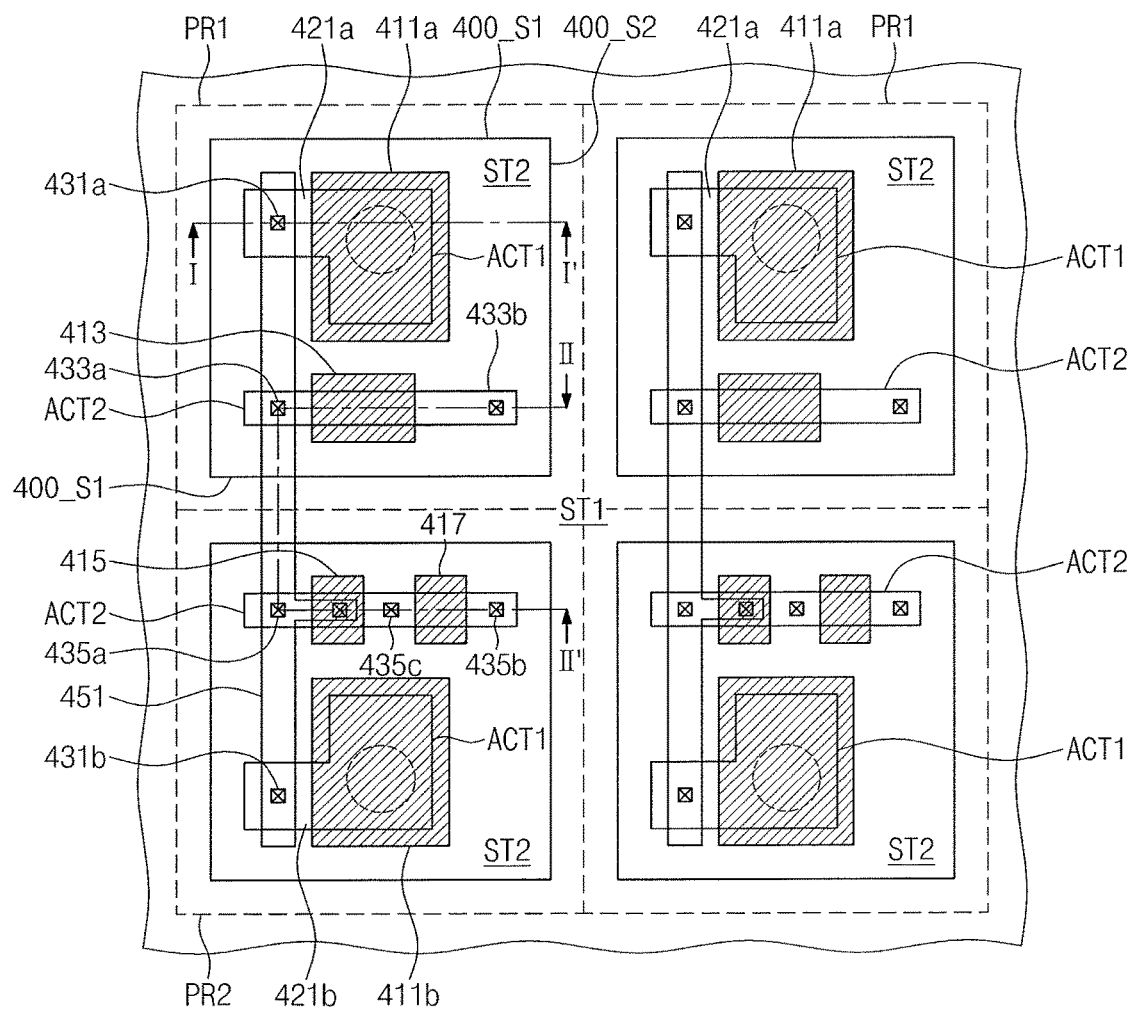
FIG. 8A illustrates a plan view of a semiconductor device according to some embodiments.
Figure 8A:
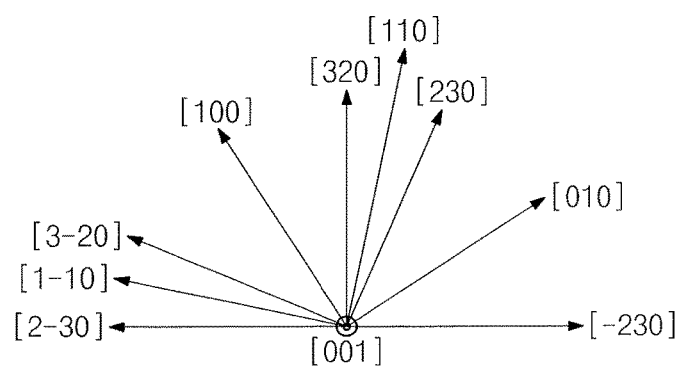
Figure 8B:
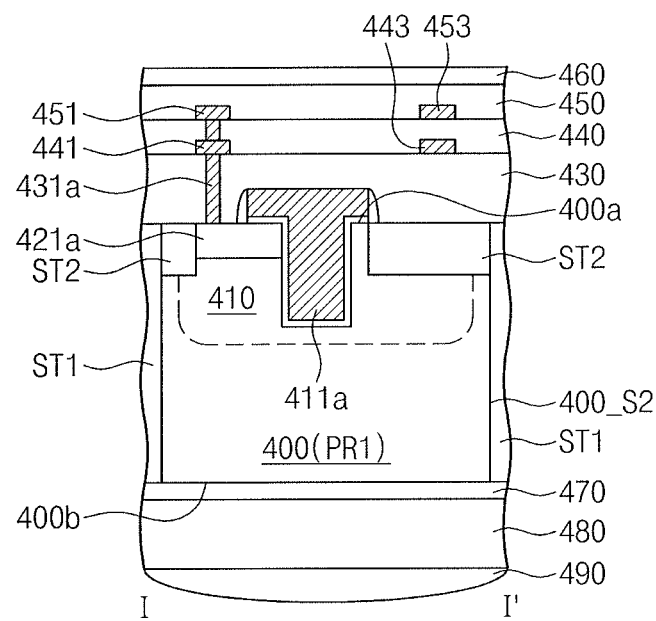
FIG. 8B illustrates a cross-sectional view taken along a line I-I' of FIG. 8A.
Figure 8B:
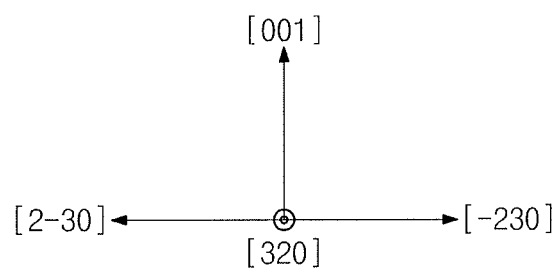
Figure 8C:
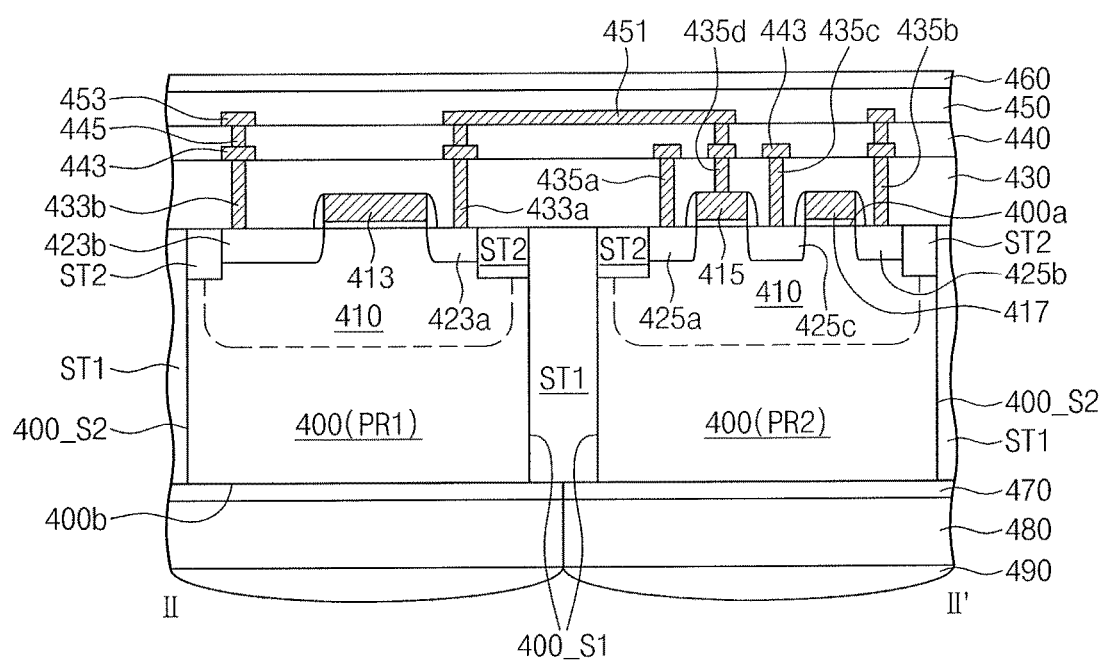
FIG. 8C illustrates a cross-sectional view taken along a line II-II' of FIG. 8A.

FIG. 8A illustrates a plan view of a semiconductor device according to some embodiments. FIG. 8B illustrates a cross-sectional view taken along a line I-I' of FIG. 8A. FIG. 8C illustrates a cross-sectional view taken along a line II-II' of FIG. 8A.

Referring to FIGS. 8A to 8C, a semiconductor substrate 400 having a first conductivity type may be provided. The semiconductor substrate 400 may have a first surface 400a and a second surface 400b which are opposite to each other. The semiconductor substrate 400 may have a crystal structure of a cubic system. For example, the semiconductor substrate 400 may have a diamond crystal structure. For example, the semiconductor substrate 400 may include single-crystalline silicon doped with N-type dopants or single-crystalline germanium doped with N-type dopants. In some embodiments, a concentration of dopants of the first conductivity type in the semiconductor substrate 400 may become progressively less from the first surface 400*a* toward the second surface 400*b*.

The first surface 400*a* and/or the second surface 400*b* of the semiconductor substrate 400 may have at least one plane included in a {100} family of planes of the crystal structure of the semiconductor substrate 400. A (100) plane, a (−100) plane, a (010) plane, a (0-10) plane, a (001) plane, and a (00-1) plane of the crystal structure of the semiconductor substrate 400 may be included in the {100} family of planes of the crystal structure of the semiconductor substrate 400 and may be crystallographically equivalent to each other. Hereinafter, the first surface 400*a* and/or the second surface 400*b* of the semiconductor substrate 400, which have the (001) planes as illustrated in FIGS. 8A to 8C, will be described as an example.

The semiconductor substrate 400 may include first and second pixel regions PR1 and PR2 defined by a first device isolation layer ST1. For example, the first device isolation layer ST1 may include at least one of silicon oxide or silicon oxynitride.

Each of the pixel regions PR1 and PR2 may include a first sidewall 400_S1 and a second sidewall 400_S2. The first sidewall 400_S1 may have at least one plane included in a {320} family of planes of the crystal structure of the semiconductor substrate 400 or at least one plane similar to the {320} family of planes of the crystal structure of the semiconductor substrate 400. The {320} family of planes of the crystal structure of the semiconductor substrate 400 may include a (320) plane, a (−320) plane, a (3-20) plane, a (−3-20) plane, a (230) plane, a (−230) plane, a (2-30) plane, a (−2-30) plane, a (302) plane, a (−302) plane, a (30-2) plane, a (−30-2) plane, a (203) plane, a (−203) plane, a (20-3) plane, a (−20-3) plane, a (032) plane, a (0-32) plane, a (03-2) plane, a (0-3-2) plane, a (023) plane, a (0-23) plane, a (02-3) plane, and a (0-2-3) plane of the crystal structure of the semiconductor substrate 400, which are crystallographically equivalent to each other. The first sidewall 400_S1 may be substantially perpendicular to the first surface 400*a* and/or the second surface 400*b* of the semiconductor substrate 400. Thus, when the first surface 400*a* and/or the second surface 400*b* of the semiconductor substrate 400 have the (001) planes, the first sidewall 400_S1 may have the (320) plane, the (−320) plane, the (3-20) plane, the (−3-20) plane, the (230) plane, the (−230) plane, the (2-30) plane, or the (−2-30) plane. Hereinafter, as illustrated in FIGS. 8A to 8C, embodiments will be described using the first sidewall 400_S1 having the (320) plane as an example.

In some embodiments, the second sidewall 400_S2 may also have at least one plane included in the {320} family of planes of the crystal structure of the semiconductor substrate 400 or at least one plane similar to the {320} family of planes of the crystal structure of the semiconductor substrate 400. For example, the second sidewall 400_S2 may be substantially perpendicular to the first sidewall 400_S1, as illustrated in FIG. 8A. In this case, the second sidewall 400_S2 may have the (−230) plane of the crystal structure of the semiconductor substrate 400.

The first device isolation layer ST1 may vertically extend from the first surface 400*a* to the second surface 400*b* of the semiconductor substrate 400. For example, a vertical thickness of the first device isolation layer ST1 may be substantially equal to a vertical thickness of the semiconductor substrate 400. The first device isolation layer ST1 may be in contact with the sidewalls 400_S1 and 400_S2 of each of the pixel regions PR1 and PR2, and thus an interface may be formed between the first device isolation layer ST1 and the sidewalls 400_S1 and 400_S2 of each of the pixel regions PR1 and PR2. The periodicity of the crystal structure of the semiconductor substrate 400 (or the arrangement of semiconductor atoms included in the semiconductor substrate 400) may be broken at the interface between the first device isolation layer ST1 and the sidewalls 400_S1 and 400_S2 of each of the pixel regions PR1 and PR2. Thus, interface traps may be generated at the interface between the first device isolation layer ST1 and the sidewalls 400_S1 and 400_S2 of each of the pixel regions PR1 and PR2.

As described with reference to FIGS. 2A to 2C and 3, the two-dimensional interface trap concentration may be low at the sidewall having at least one plane of the {320} family of planes or at least one plane similar to the {320} family of planes, and the difference between the intrinsic Fermi level and the interface trap energy level may be great at the sidewall having at least one plane of the {320} family of planes or at least one plane similar to the {320} family of planes. The semiconductor device according to some embodiments may include the pixel regions PR1 and PR2 which have the sidewalls 400_S1 and 400S2 having the crystal planes included in the {320} family of planes or crystal planes similar to the {320} family of planes. Thus, the two-dimensional interface trap concentration may be low at the interface between the first device isolation layer ST1 and the sidewalls 400_S1 and 400_S2 of each of the pixel regions PR1 and PR2, and the difference between the intrinsic Fermi level and the interface trap energy level may be great at the interface between the first device isolation layer ST1 and the sidewalls 400_S1 and 400_S2 of each of the pixel regions PR1 and PR2. As a result, it is possible to inhibit a leakage current from occurring at the interface between the first device isolation layer ST1 and the sidewalls 400_S1 and 400_S2 of each of the pixel regions PR1 and PR2.

In some embodiments, the first and second pixel regions PR1 and PR2 may be alternately arranged in a direction substantially parallel to a [320] direction of the crystal structure of the semiconductor substrate 400. The first pixel regions PR1 may be arranged in a direction substantially parallel to a [−230] direction, and the second pixel regions PR2 may also be arranged in the direction substantially parallel to the [−230] direction.

A well dopant layer 410 having a second conductivity type may be disposed in each of the first and second pixel regions PR1 and PR2. The well dopant layer 410 may be disposed adjacent to the first surface 400*a* of the semiconductor substrate 400 and may include, for example, P-type dopants. A depth of the well dopant layer 410 from the first surface 400*a* may be smaller than a depth of the first device isolation layer ST1 from the first surface 400*a*.

In addition, a second device isolation layer ST2 may be formed adjacent to the first surface 400*a* of the semiconductor substrate 400. The second device isolation layer ST2 may define a first active portion ACT1 and a second active portion ACT2. The second device isolation layer ST2 may be formed in the well dopant layer 410 and may define the first and second active portions ACT1 and ACT2 in each of the first and second pixel regions PR1 and PR2. The first and second active portions ACT1 and ACT2 may correspond to portions of the well dopant layer 410, respectively. The first and second active portions ACT1 and ACT2 may be spaced apart from each other in each of the first and second pixel regions PR1 and PR2 and may have sizes different from each other.

In some embodiments, as illustrated in FIG. 8A, the second active portions ACT2 may be adjacent to each other when viewed in a plan view. For example, the second active portions ACT2 of the first and second pixel regions PR1 and PR2 adjacent to each other may be disposed between the first active portions ACT1 of the first and second pixel regions PR1 and PR2 adjacent to each other when viewed in a plan view. A vertical depth of the second device isolation layer ST2 from the first surface 400a may be smaller than the vertical depth of the first device isolation layer ST1 from the first surface 400a. A bottom surface of the second device isolation layer ST2 may be disposed in the well dopant layer 410.

A first transfer gate 411a and a first floating diffusion region 421a may be disposed at the first active portion ACT1 of the first pixel region PR1, and a second transfer gate 411b and a second floating diffusion region 421b may be disposed at the first active portion ACT1 of the second pixel region PR2.

The first and second transfer gates 411a and 411b may be disposed at central portions of the first and second pixel regions PR1 and PR2, respectively, when viewed in a plan view. Each of the first and second transfer gates 411a and 411b may include a lower portion disposed in a trench formed in the well dopant layer 410 and an upper portion connected to the lower portion. The upper portion of each of the first and second transfer gates 411a and 411b may protrude upward from the first surface 400a of the semiconductor substrate 400. Bottom surfaces of the first and second transfer gates 411a and 411b may be lower than the first surface 400a of the semiconductor substrate 400, and a gate insulating layer may be disposed between each of the well dopant layers 410 and each of the first and second transfer gates 411a and 411b. In some embodiments, the trenches may be formed in the well dopant layers 410 exposed at the first active portions ACT1, and the gate insulating layer and a gate conductive layer may be sequentially formed on inner surfaces of the trenches and the first surface 400a of the semiconductor substrate 400. Thereafter, the gate conductive layer may be patterned to form the first and second transfer gates 411a and 411b.

The first floating diffusion region 421a may be formed in the well dopant layer 410 at a side of the first transfer gate 411a, and the second floating diffusion region 421b may be formed in the well dopant layer 410 at a side of the second transfer gate 411b. The first and second floating diffusion regions 421a and 421b may have the first conductivity type opposite to the second conductivity type of the well dopant layer 410. For example, N-type dopant ions may be implanted into the well dopant layers 410 to form the first and second floating diffusion regions 421a and 421b.

Logic transistors may be formed at the second active portions ACT2 of the first and second pixel regions PR1 and PR2. In some embodiments, a reset transistor may be formed at the second active portion ACT2 of the first pixel region PR1, and a source follower transistor and a selection transistor may be formed at the second active portion ACT2 of the second pixel region PR2. The first and second pixel regions PR1 and PR2 may share the logic transistors.

In some embodiments, a reset gate 413 may be disposed on the second active portion ACT2 of the first pixel region PR1, and a source follower gate 415 and a selection gate 417 may be disposed on the second active portion ACT2 of the second pixel region PR2. A gate insulating layer may be disposed between the well dopant layer 410 and each of the reset gate 413, source follower gate 415, and selection gate 417.

A first dopant region 423a may be formed in the well dopant layer 410 at a side of the reset gate 413, and a second dopant region 423b may be formed in the well dopant layer 410 at another side of the reset gate 413. A third dopant region 425a may be formed in the well dopant layer 410 at a side of the source follower gate 415, and a fourth dopant region 425b may be formed in the well dopant layer 410 at a side of the selection gate 417. In addition, a common dopant region 425c may be formed in the well dopant layer 410 between the source follower gate 415 and the selection gate 417.

In some embodiments, the first to fourth dopant regions 423a, 423b, 425a, and 425b and the common dopant region 425c may be formed by implanting dopant ions of which a conductivity type is opposite to that of the well dopant layer 410. For example, the first to fourth dopant regions 423a, 423b, 425a, and 425b and the common dopant region 425c may be N-type dopant regions.

An interconnection structure may be disposed on the first surface 400a of the semiconductor substrate 400. The interconnection structure may include conductive lines 441, 443, 451, and 453 and contact plugs 431a, 431b, 433a, 433b, 435a, 435b, 435c, and 435d, which are connected to the logic transistors. For example, interlayer insulating layers 430, 440, and 450 and a passivation layer 460 may be disposed on the first surface 400a of the semiconductor substrate 400. The interlayer insulating layers 430, 440, and 450 may cover the first and second transfer gates 411a and 411b and the reset, source follower and selection gates 413, 415, and 417. A plurality of the contact plugs 431a, 431b, 433a, 433b, 435a, 435b, 435c, and 435d and a plurality of the conductive lines 441, 443, 451, and 453 may be disposed in the interlayer insulating layers 430, 440, and 450.

First and second FD contact plugs 431a and 431b may be connected to the first and second floating diffusion regions 421a and 421b, respectively. A first contact plug 433a may be connected to the first dopant region 423a, and a second contact plug 433b may be connected to the second dopant region 423b. A third contact plug 435a may be connected to the third dopant region 425a, and a fourth contact plug 435b may be connected to the fourth dopant region 425b. A common contact plug 435c may be connected to the common contact plug 425c. In addition, a gate contact plug 435d may be connected to the source follower gate 415.

Each of the contact plugs 431a, 431b, 433a, 433b, 435a, 435b, 435c, and 435d may include a barrier metal layer and a metal layer. For example, the barrier metal layer may be formed of a metal nitride such as titanium nitride, tantalum nitride, tungsten nitride, hafnium nitride, and/or zirconium nitride. The metal layer may be formed of at least one of tungsten, copper, hafnium, zirconium, titanium, tantalum, aluminum, ruthenium, palladium, platinum, cobalt, nickel, or a conductive metal nitride. In some embodiments, a silicide layer may be formed between each of the contact plugs 431a, 431b, 433a, 433b, 435a, 435b, and 435c and each of the dopant regions 421a, 421b, 423a, 423b, 425a, 425b, and 425c.

The first and second floating diffusion regions 421a and 421b may be electrically connected to each other through a connection line 451. In some embodiments, the connection line 451 may intersect the first and second pixel regions PR1 and PR2 and may be electrically connected to the first and second floating diffusion regions 421a and 421b through the first and second FD contact plugs 431a and 431b. In addition, the connection line 451 may be electrically connected to the first dopant region 423a through the first contact plug 433a and may be electrically connected to the source follower gate 415 through the gate contact plug 435d.

Furthermore, a power line to which a power voltage is applied may be connected to the second and third contact plugs 433*b* and 435*a*, and an output line through which an optical signal generated in each pixel is transmitted may be connected to the fourth contact plug 435*b*. The conductive lines 441, 443, 451, and 453 such as the connection line, the power line, and the output line may be formed of at least one of copper (Cu), aluminum (Al), tungsten (W), titanium (Ti), molybdenum (Mo), tantalum (Ta), titanium nitride (TiN), tantalum nitride (TaN), zirconium nitride (ZrN), or any alloy thereof.

A color filter layer 480 and micro lenses 490 may be disposed on the second surface 400*b* of the semiconductor substrate 400. In addition, a protective planarization layer 470 may be disposed between the second surface 400*b* of the semiconductor substrate 400 and the color filter layer 480.

The protective planarization layer 470 may be a high-concentration dopant layer and may be doped with P-type dopants such as boron (B). The protective planarization layer 470 may prevent or inhibit a depletion well from occurring at the second surface 400*b* of the semiconductor substrate 400 by electric potential drop caused by dangling defects of silicon, surface defects caused by etching stress, and/or interface traps. In addition, the protective planarization layer 470 may provide a potential gradient in such a way that photocharges generated in a portion of the semiconductor substrate 400 adjacent to the second surface 400*b* flow into the first and second floating diffusion regions 421*a* and 421*b*.

Color filters of the color filter layer 480 and the micro lenses 490 may be formed to correspond to the first and second pixel regions PR1 and PR2, respectively. The color filter layer 480 may include red, green, and blue color filters. The color filters may be two-dimensionally arranged. In certain embodiments, the color filters may include a yellow filter, a magenta filter, and a cyan filter. In addition, the color filter layer 480 may further include a white filter.

The micro lens 490 may have a convex shape and may have a specific radius of curvature. The micro lens 490 may be formed of a light-transmitting resin and may concentrate incident light to each of the first and second pixel regions PR1 and PR2.

By way of summation and review, a periodicity of a crystal structure of a semiconductor substrate may be broken at an interface between the semiconductor substrate and the insulating layer. Thus, interface traps could occur at the interface between the semiconductor substrate and the insulating layer. Such interface traps could deteriorate operating characteristics of a semiconductor device.

The semiconductor device according to some embodiments may include the trench which includes the inner sidewall having at least one plane included in the {320} family of planes or at least one plane similar to the {320} family of planes. Thus, the two-dimensional interface trap concentration may be low at the interface between the inner sidewall of the trench and the insulating layer, and the difference ($|E_i - E_{it}|$) between the intrinsic Fermi level and the interface trap energy level may be great at the interface between the inner sidewall of the trench and the insulating layer. As a result, it is possible to inhibit the leakage current from occurring at the inner sidewall of the trench.

The embodiments may provide a semiconductor device capable of improving reliability.

The embodiments may provide a method for manufacturing a semiconductor device with improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a semiconductor substrate including:
        an active region defined by a device isolation layer; and
        a trench intersecting the active region to extend into the device isolation layer, the semiconductor substrate having a crystal structure;
    a gate electrode in the trench;
    a gate insulating layer between the gate electrode and the semiconductor substrate such that the gate insulating layer is in contact with the semiconductor substrate; and
    source/drain regions at both sides of the trench,
    wherein the trench, at an interface with the gate insulating layer, includes an inner sidewall that has at least one plane in a {320} family of planes of the crystal structure or at least one plane similar to the {320} family of planes, and
    wherein a top surface of the semiconductor substrate has at least one plane in a {100} family of planes of the crystal structure.

2. The semiconductor device as claimed in claim 1, wherein the semiconductor substrate has a diamond crystal structure.

3. The semiconductor device as claimed in claim 2, wherein the semiconductor substrate is a single-crystalline silicon substrate or a single-crystalline germanium substrate.

4. The semiconductor device as claimed in claim 1, wherein:
    the gate insulating layer includes a silicon oxide layer or a silicon oxynitride layer.

5. The semiconductor device as claimed in claim 1, wherein:
    the top surface of the semiconductor substrate has a (001) plane of the crystal structure, and
    the trench extends in a [−230] direction of the crystal structure.

6. The semiconductor device as claimed in claim 1, wherein:
    the trench has a long axis that extends in a first direction when viewed in a plan view,
    the active region has a rectangular shape having a long axis in a second direction when viewed in a plan view, and
    an angle between the first direction and the second direction ranges from 65.38 degrees to 69.38 degrees when viewed in a plan view.

7. The semiconductor device as claimed in claim 6, wherein:
    the active region includes a sidewall extending in the second direction, and
    the sidewall of the active region has a (3-20) plane of the crystal structure.

8. The semiconductor device as claimed in claim 6, wherein:

the first direction is a [−230] direction of the crystal structure, and the second direction is a [230] direction of the crystal structure.

9. The semiconductor device as claimed in claim 1, further comprising:
   a bit line electrically connected to one of the source or drain region; and
   a data storage part electrically connected to the other of the source or drain region.

10. A semiconductor device, comprising:
    a semiconductor substrate having a crystal structure and including an active pattern defined by a device isolation layer, the active pattern including a sidewall having at least one plane in a {320} family of planes of the crystal structure or at least one plane similar to the {320} family of planes;
    a gate electrode intersecting the active pattern;
    a gate insulating layer between the gate electrode and the active pattern such that the gate insulating layer is in contact with the semiconductor substrate and the sidewall of the active pattern, at the interface with the gate insulating layer, has the at least one plane in a {320} family of planes of the crystal structure or at least one plane similar to the {320} family of planes; and
    source/drain regions at both sides of the gate electrode,
    wherein a top surface of the semiconductor substrate has at least one plane in a {100} family of planes of the crystal structure.

11. The semiconductor device as claimed in claim 10, wherein the semiconductor substrate has a diamond crystal structure.

12. The semiconductor device as claimed in claim 10, wherein:
    the gate insulating layer includes a silicon oxide layer or a silicon oxynitride layer.

13. The semiconductor device as claimed in claim 10, wherein:
    the top surface of the semiconductor substrate has a (001) plane of the crystal structure, and
    the active pattern extends in a [−230] direction of the crystal structure.

14. A semiconductor device, comprising:
    a semiconductor substrate including a trench, the semiconductor substrate having a crystal structure; and
    an insulating layer covering an inner sidewall of the trench such that the insulating layer is in contact with the inner sidewall of the trench,
    wherein the inner sidewall of the trench, at an interface with the insulating layer, has at least one plane in a {320} family of planes of the crystal structure or a plane having an angle within 2 degrees of the {320} family of planes of the crystal structure, and
    wherein a top surface of the semiconductor substrate has at least one plane in a {100} family of planes of the crystal structure.

15. The semiconductor device as claimed in claim 14, wherein the trench extends in one direction included in a <230> family of directions of the crystal structure.

16. The semiconductor device as claimed in claim 14, wherein:
    the top surface of the semiconductor substrate has a (001) plane of the crystal structure,
    the inner sidewall of the trench has a (320) plane of the crystal structure, and
    the trench extends in a [−230] direction of the crystal structure.

17. The semiconductor device as claimed in claim 14, wherein:
    the insulating layer includes a silicon oxide layer or a silicon oxynitride layer.

* * * * *